(12) United States Patent
Lin et al.

(10) Patent No.: US 11,107,981 B2
(45) Date of Patent: Aug. 31, 2021

(54) HALIDE SEMICONDUCTOR MEMRISTOR AND NEUROMORPHIC DEVICE

(71) Applicant: National Tsing Hua University, Hsinchu (TW)

(72) Inventors: Hao-Wu Lin, Hsinchu (TW); Chien-Yu Chen, Hsinchu (TW); Tse-Wei Chen, Hsinchu (TW); Li-Wei Chen, Hsinchu (TW); Wei-Chun Wang, Hsinchu (TW); Chih-Ting Hsu, Hsinchu (TW)

(73) Assignee: National Tsing Hua University

( * ) Notice: Subject to any disclaimer, the term of this patent is extended or adjusted under 35 U.S.C. 154(b) by 40 days.

(21) Appl. No.: 16/585,236

(22) Filed: Sep. 27, 2019

(65) Prior Publication Data

US 2021/0013402 A1 Jan. 14, 2021

(30) Foreign Application Priority Data

Jul. 10, 2019 (TW) ................................ 108124339

(51) Int. Cl.
*H01L 45/00* (2006.01)
*H01L 27/24* (2006.01)
*G06N 3/063* (2006.01)

(52) U.S. Cl.
CPC .......... *H01L 45/085* (2013.01); *G06N 3/063* (2013.01); *H01L 27/2463* (2013.01); *H01L 45/1266* (2013.01); *H01L 45/146* (2013.01); *H01L 45/147* (2013.01)

(58) Field of Classification Search
CPC .............. H01L 27/2463–249; H01L 45/08–10
See application file for complete search history.

*Primary Examiner* — John A Bodnar

(57) ABSTRACT

Disclosures of the present invention describe a halide semiconductor memristor that is suitable for being as an artificial synapse. The halide semiconductor memristor comprises a first electrode layer, an active layer and a second electrode layer, wherein the active layer comprises a first oxide semiconductor film formed on the first electrode layer, a halide semiconductor film formed on the first oxide semiconductor film, and a second oxide semiconductor film formed on the halide semiconductor film Moreover, a variety of experimental data have proved that, this halide semiconductor memristor is indeed suitable for being adopted as a plurality of artificial synapses that are used in manufacture of a neuromorphic device, and exhibits many advantages, including: capable of being driven by a low operation voltage, having a multi-stage adjustable resistance state, and a wide dynamic range of the switching resistance states.

9 Claims, 18 Drawing Sheets

HALIDE SEMICONDUCTOR MEMRISTOR AND NEUROMORPHIC DEVICE

BACKGROUND OF THE INVENTION

1. Field of the Invention

The present invention relates to the technology field of memristor devices, and more particularly to a halide semiconductor memristor and a neuromorphic device using a number of the halide semiconductor memristors as a plurality of artificial synapses.

2. Description of the Prior Art

FIG. 1 illustrates a block diagram for describing a traditional Von Neumann architecture. Von Neumann architecture 1' is also called Princeton architecture and comprises a control unit 11', an arithmetic logic unit (ALU) 12', a memory 13', an input unit 14', and an output unit 15'. Von Neumann architecture 1' is one type of computer's framework, and has a principal technology feature of using memory 13' to store application program and data. As FIG. 1 shows, the computer of Von Neumann architecture 1' adopts the ALU 12' to access the application program and/or the data that are stored in the memory 13'. However, there is a system bottleneck existing in the computer of Von Neumann architecture 1'. In case of the occurrence of the system bottleneck, the computing throughput of the computer is limited due to inadequate rate of data transfer between memory 13' and the ALU 12'. It is worth explaining that, the term "Von Neumann bottleneck" was coined by John Backus in 1978 for being representative of the forgoing system bottleneck.

To overcome the Von Neumann bottleneck as well as getting faster memory access and lower power consumption of computing, neuromorphic computing system is therefore developed and proposed to be an another type of computer's framework. FIG. 2 depicts a block diagram for introducing a conventional neuromorphic computing system. As FIG. 2 shows, the conventional neuromorphic computing system 1a comprises: a control unit 11a, an artificial neural network (ANN) unit 12a, an input unit 14a, and an output unit 15a. Particularly, the ANN unit 12a is configured to simultaneously have functions of the ALU unit 12' and the memory 13' that are shown in FIG. 1. As such, the ANN unit 12a is able to complete processing of arithmetic logic and storing of data according to the controlling command transmitted from the control unit 11a. As a result, compared to the computer of Von Neumann architecture 1' (as shown in FIG. 1), this neuromorphic computing system 1a exhibits advantages of high performance, low computing time, and low power consumption.

On the other hand, FIG. 3 illustrates a structure diagram of an integrated circuit of the neuromorphic computing system that is shown in FIG. 2. As FIG. 3 shows, the integrated circuit structure of the neuromorphic computing system 1a comprises: a plurality of artificial synapses AS, wherein each the artificial synapse AS is a memristor device consisting of an active layer 121a, a first electrode 122a and a second electrode 123a. As described more in detail below, the first electrode 122a and the second electrode 123a are respectively connected to a pre-neuron electrode PRN and a post-neuron electrode PON that are disposed on a substrate 120a. By such arrangement, there are many memristor devices disposed on the substrate 120a. Memristor is one type of resistive random-access memory (RRAM), and is used as the artificial synapse AS because of having synaptic plasticity.

For example, a prior art document of U.S. patent publication No. 2018/0351095A1 discloses a memristor device having an amorphous SrTiO film and an amorphous $SrTiO_{3-x}$ film that are adopted for constituting the active layer 121a as shown in FIG. 3. Moreover, from disclosures of the prior art document, it is understood that two Pt-made electrodes are used as the first electrode 122a and the first electrode as shown in FIG. 3. However, FIG. 2 of the prior art document has reported that, in order to drive the memristor device that consists of one amorphous SrTiO film, one amorphous $SrTiO_{3-x}$ film, and two Pt-made electrode to change its state from high resistance to low resistance, it must applies an operating voltage that is greater than 1 volt to the memristor device. Briefly speaking, the memristor device disclosed by the U.S. patent publication No. 2018/0351095A1 has a principal drawback of high operating voltage.

In addition, another one prior art document of U.S. Pat. No. 10,186,660B2 discloses a different type of memristor device, which comprises an active layer made of a $HfO_2$ film, a Ta-made electrode and a Pt-made electrode. It is worth noting that, FIG. 3C of the prior art document has indicated that, there is merely 1 order of dynamic range of analog switching in the memristor device that consists of one $HfO_2$ film, one Ta-made electrode and one Pt-made electrode. The analog switching means that the memristor device is switched from a high/low resistance state to a low/high resistance state. Briefly speaking, the memristor device disclosed by the U.S. Pat. No. 10,186,660B2 has a disadvantage of having narrow dynamic range of state switching.

Furthermore, literature I has disclosed that an amount of memristor devices are arranged to a matrix form as shown in FIG. 3. Herein, literature A is written by Prezioso et. al, and is entitled with "Spike-timing-dependent plasticity learning of coincidence detection with passively integrated memristive circuits" so as to be published on Nature Communications 9(2018), 5311. Disclosures of literature I has taught that a memristor device having $HfO_2$-made active layer. Moreover, FIG. 8 of literature I has revealed that, after applying an identical operating voltage to twenty memristor devices using $HfO_2$ film as their active layer, there are twenty various spike-timing-dependent plasticity (STDP) measured from the twenty memristor devices in the case of using the same measurement method. In conclusion, despite the fact that literature I discloses a memristor array apparatus, the memristor devices of the memristor array apparatus fail to has a device performance with consistence and repeatability.

From above descriptions, it is aware that how to improve above-motioned drawbacks that the memristor device and the memristor array apparatus show in practical application has therefore become the most important issue for a manufacturer of artificial neural network (ANN) chip. In view of that, inventors of the present application have made great efforts to make inventive research and eventually provided a halide semiconductor memristor and a neuromorphic device using the halide semiconductor memristor.

SUMMARY OF THE INVENTION

The primary objective of the present invention is to disclose a halide semiconductor memristor that is suitable for being as an artificial synapse. The halide semiconductor memristor comprises a first electrode layer, an active layer and a second electrode layer, wherein the active layer comprises a first oxide semiconductor film formed on the first electrode layer, a halide semiconductor film formed on the first oxide semiconductor film, and a second oxide semiconductor film formed on the halide semiconductor film By such arrangement, there is a first carrier energy barrier formed between the first oxide semiconductor film and the halide semiconductor film as well as a second carrier energy barrier formed between the second oxide semiconductor film and the halide semiconductor film Moreover, a variety of experimental data have proved that, this halide semiconductor memristor is suitable for being adopted as a plurality of artificial synapses that are used in manufacture of a neuromorphic device, and exhibits many advantages, including: capable of being driven by a low operation voltage, having a multi-stage adjustable resistance state, and a wide dynamic range of the switching resistance states.

For achieving the primary objective of the present invention, the present invention provides an embodiment of the halide semiconductor memristor, which is suitable for being as an artificial synapse, and comprises:

a first electrode layer;
an active layer, comprising:
  a first oxide semiconductor film formed on the first electrode layer, having a first conduction band minimum (CBM) level, a first fermi level and a first valence band minimum (VBM) level;
  a halide semiconductor film formed on the first oxide semiconductor film, having a second CBM level, a second fermi level and a second VBM level; and
  a second oxide semiconductor film formed on the halide semiconductor film, having a third CBM level, a third fermi level and a third VBM level; and
a second electrode layer formed on the second oxide semiconductor film;
wherein the first CBM level of the first oxide semiconductor film is deeper than the second CBM level of the halide semiconductor film, the first fermi level of the first oxide semiconductor film being deeper than the second fermi level of the halide semiconductor film, and the first VBM level of the first oxide semiconductor film being deeper than the second VBM level of the halide semiconductor film, such that a first carrier energy barrier is formed between the first oxide semiconductor film and the halide semiconductor film in case of a first equivalent energy-level structure being formed between the first oxide semiconductor film and the halide semiconductor film;
wherein the third CBM level of the second oxide semiconductor film is deeper than the second CBM level of the halide semiconductor film, the third fermi level of the second oxide semiconductor film being deeper than the second fermi level of the halide semiconductor film, and the third VBM level of the second oxide semiconductor film being deeper than the second VBM level of the halide semiconductor film, such that a second carrier energy barrier is formed between the second oxide semiconductor film and the halide semiconductor film in case of a second equivalent energy-level structure being formed between the second oxide semiconductor film and the halide semiconductor film Moreover, the present invention also provides an embodiment of a neuromorphic device, comprising:
a substrate;
a signal receiving unit, being disposed on the substrate, and comprising a plurality of signal receiving electrodes;
a plurality of halide semiconductor memristors, being disposed on the substrate, and being respectively used as a plurality of artificial synapses; wherein each of the plurality of halide semiconductor memristors comprise a first electrode layer, an active layer formed on the first electrode layer, and a second electrode layer formed on the active layer, and the active layer comprises:
  a first oxide semiconductor film formed on the first electrode layer, having a first conduction band minimum (CBM) level, a first fermi level and a first valence band minimum (VBM) level;
  a halide semiconductor film formed on the first oxide semiconductor film, having a second CBM level, a second fermi level and a second VBM level; and
  a second oxide semiconductor film formed on the halide semiconductor film, having a third CBM level, a third fermi level and a third VBM level; and
a signal transmitting unit, being disposed on the substrate, and comprising a plurality of signal transmitting electrodes;
wherein the respective signal receiving electrodes are connected to the respective second electrode layers, and the respective signal transmitting electrodes are connected to the respective first electrode layers;
wherein the first CBM level of the first oxide semiconductor film is deeper than the second CBM level of the halide semiconductor film, the first fermi level of the first oxide semiconductor film being deeper than the second fermi level of the halide semiconductor film, and the first VBM level of the first oxide semiconductor film being deeper than the second VBM level of the halide semiconductor film, such that a first carrier energy barrier is formed between the first oxide semiconductor film and the halide semiconductor film in case of a first equivalent energy-level structure being formed between the first oxide semiconductor film and the halide semiconductor film;
wherein the third CBM level of the second oxide semiconductor film is deeper than the second CBM level of the halide semiconductor film, the third fermi level of the second oxide semiconductor film being deeper than the second fermi level of the halide semiconductor film, and the third VBM level of the second oxide semiconductor film being deeper than the second VBM level of the halide semiconductor film, such that a second carrier energy barrier is formed between the second oxide semiconductor film and the halide semiconductor film in case of a second equivalent energy-level structure being formed between the second oxide semiconductor film and the halide semiconductor film

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a halide semiconductor memristor and neuromorphic device using a variety of the halide semiconductor memristors as a plurality of artificial synapses, embodiments of the present invention will be described in detail with reference to the attached drawings hereinafter.

Figure 1:
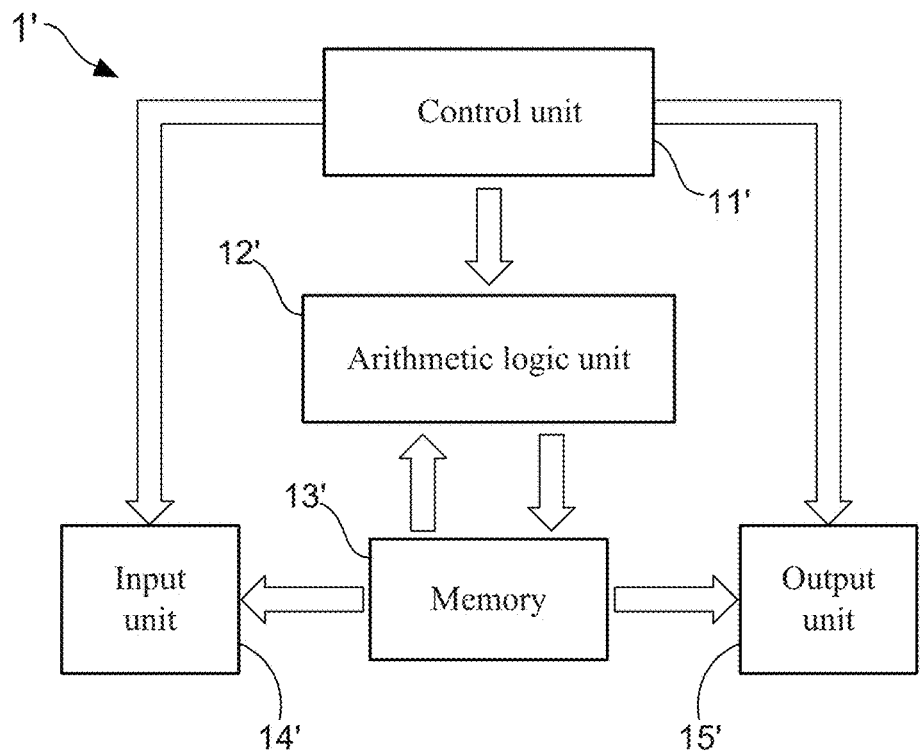
FIG. 1 shows a block diagram for describing a traditional Von Neumann architecture.
Figure 2:
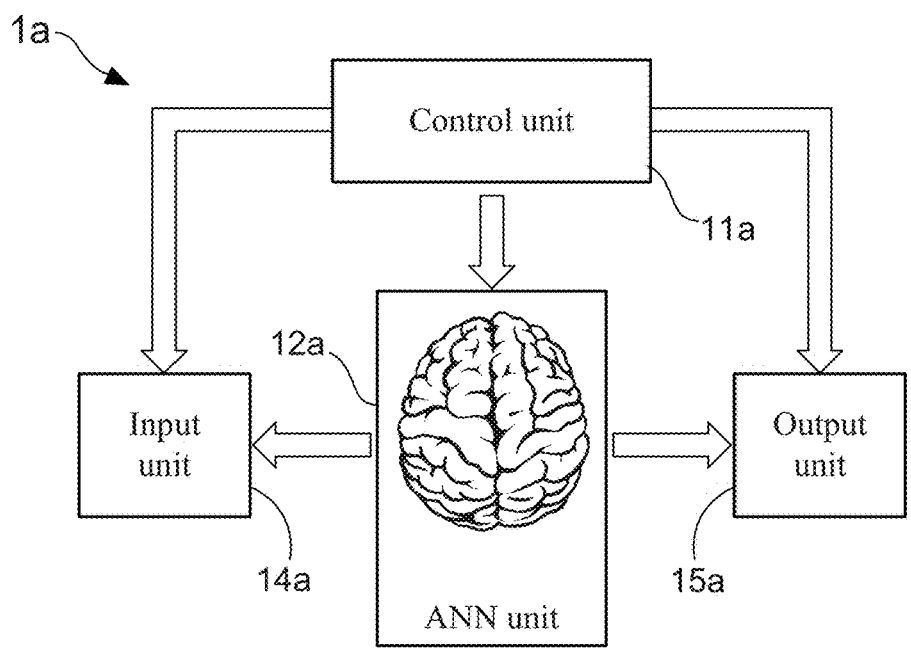
FIG. 2 shows a block diagram for introducing a conventional neuromorphic computing system.
Figure 3:
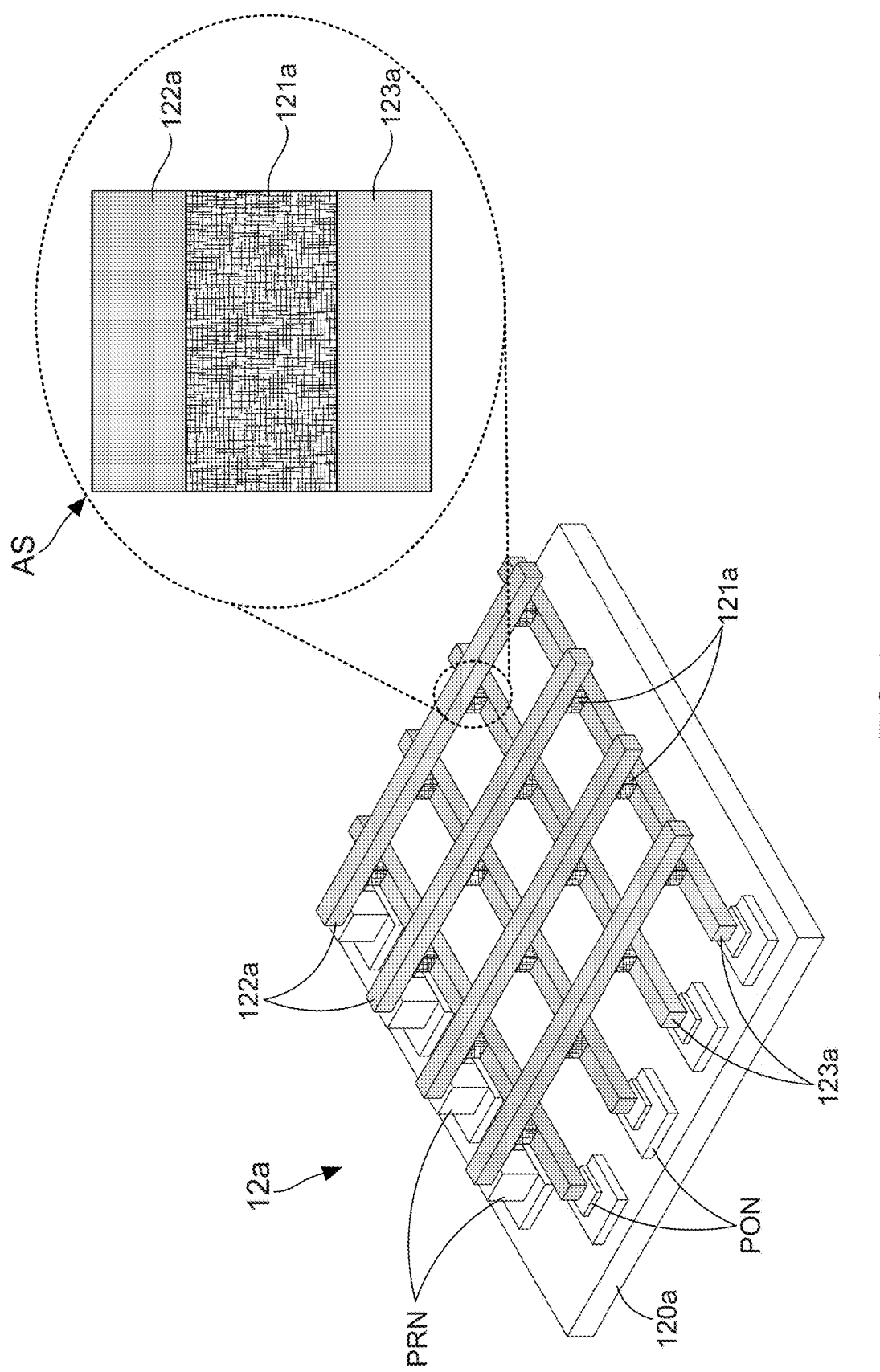
FIG. 3 shows a structure diagram of an integrated circuit of the neuromorphic computing system that is shown in FIG. 2.
Figure 4:
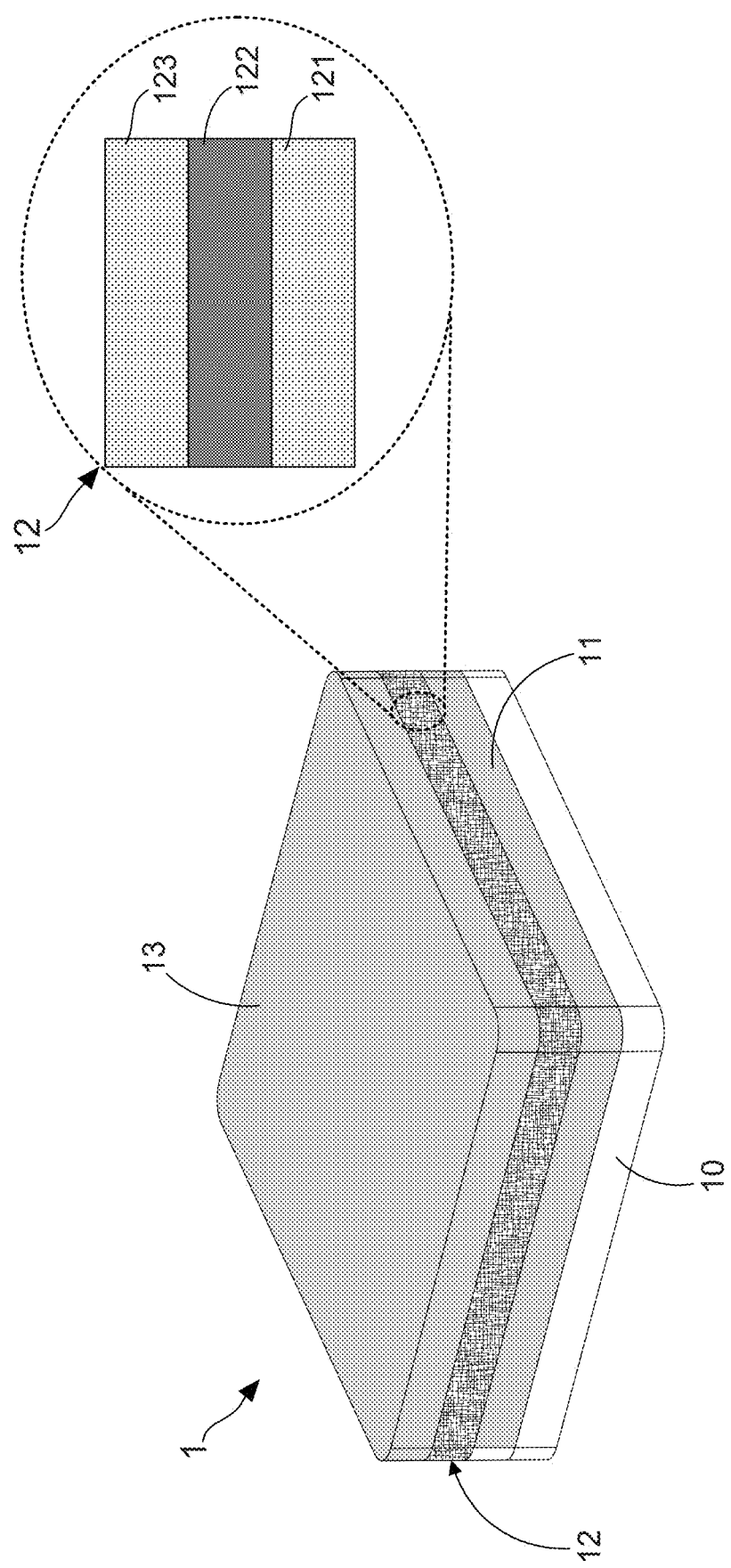
FIG. 4 shows a schematic stereo diagram of a first embodiment of a halide semiconductor memristor according to the present invention.

First embodiment of halide semiconductor memristor;

With reference to FIG. 1, there is shown a schematic stereo diagram of a first embodiment of a halide semiconductor memristor according to the present invention. The present invention discloses a halide semiconductor memristor 1, which is suitable for being as an artificial synapse, and mainly comprises a first electrode layer 11, an active layer 12 and a second electrode layer 13. In the present in invention, the active layer 12 comprises a first oxide semiconductor film 121, a halide semiconductor film 122 and a second oxide semiconductor film 123. As FIG. 4 shows, the first oxide semiconductor film 121 is formed on the first electrode layer 11, and has a first conduction band minimum (CBM) level, a first fermi level and a first valence band minimum (VBM) level. On the other hand, the halide semiconductor film 122 is formed on the first oxide semiconductor film 121, and has a second CBM level, a second fermi level and a second VBM level. As described more in detail below, the second oxide semiconductor film 123 is formed on the halide semiconductor film 122, and has a third CBM level, a third fermi level and a third VBM level. Moreover, the second electrode layer 13 is formed on the second oxide semiconductor film 123.

Figure 5A:
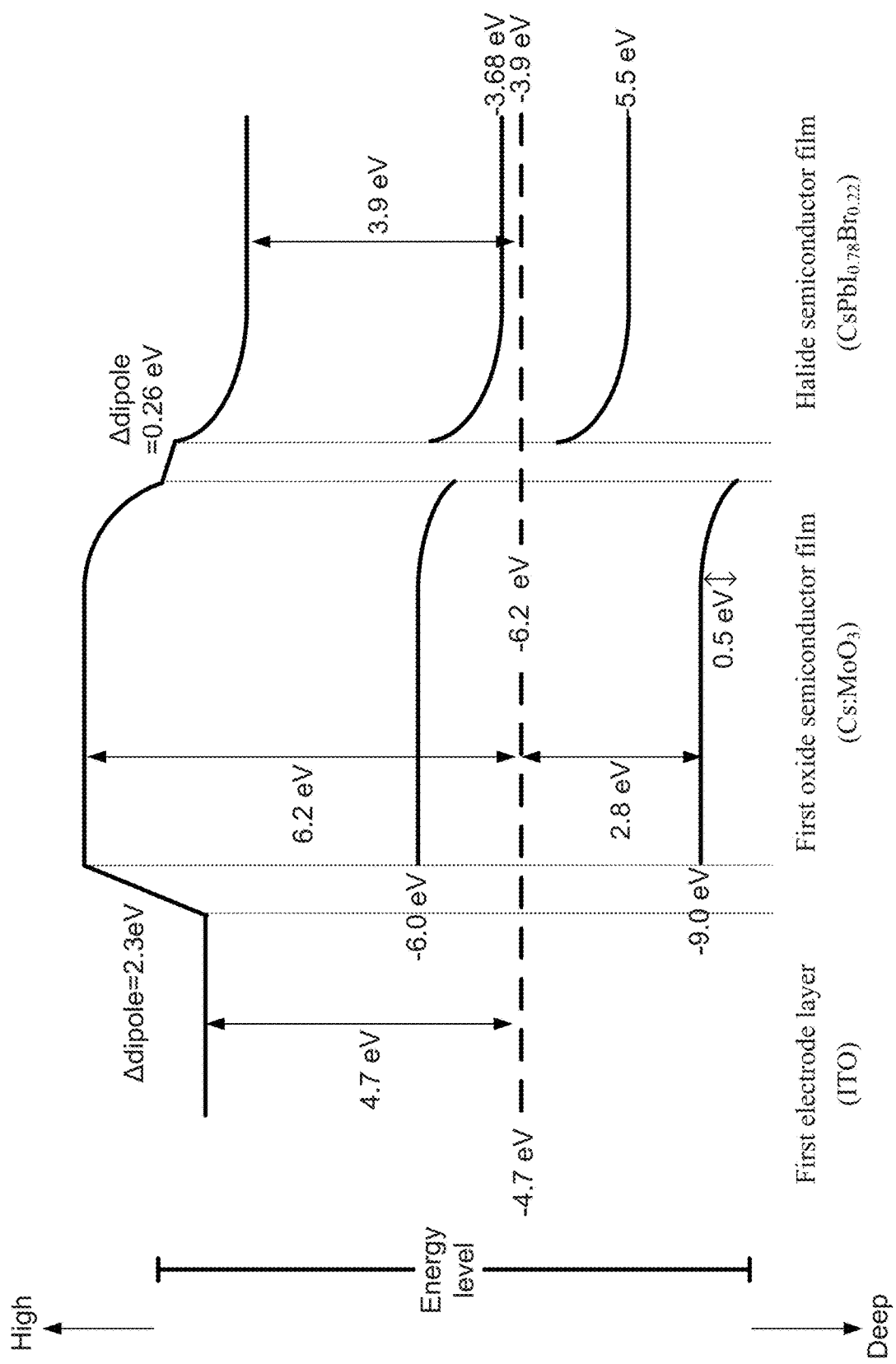
FIG. 5A shows an energy band diagram of a first electrode layer, a first oxide semiconductor film and a halide semiconductor film that are shown in FIG. 4.

FIG. 4 also depicts that the halide semiconductor memristor 1 further comprises a substrate 10 for supporting the first electrode layer 11, the active layer 12 and the second electrode layer 13. Please simultaneously refer to FIG. 5A and FIG. 5B, wherein FIG. 5A illustrates an energy band diagram of the first electrode layer 11, the first oxide semiconductor film 121 and the halide semiconductor film 122 that are shown in FIG. 4, and FIG. 5B depicts an energy band diagram of the halide semiconductor film 122, the second oxide semiconductor film 123 and the second electrode layer 13 that are shown in FIG. 4.

According to the principal design of the present invention, both the first oxide semiconductor film 121 and the second oxide semiconductor film 123 are made of a transition metal oxide that is selected from the group consisting of $NiO_x$, $CuO_x$, $CrO_x$, MoOx, $WO_3$, and $V_2O_5$. In addition, the halide semiconductor film 122 is made of a material of inorganic perovskite or a material of hybrid organic-inorganic perovskite. By such material design, as FIG. 5A shows, the first CBM level of the first oxide semiconductor film 121 is deeper than the second CBM level of the halide semiconductor film 122, the first fermi level of the first oxide semiconductor film 121 is deeper than the second fermi level of the halide semiconductor film 122, and the first VBM level of the first oxide semiconductor film 121 is deeper than the second VBM level of the halide semiconductor film 122, such that a first carrier energy barrier is formed between the first oxide semiconductor film 121 and the halide semiconductor film 122 in case of a first equivalent energy-level structure being formed between the first oxide semiconductor film 121 and the halide semiconductor film 122.

Figure 5B:
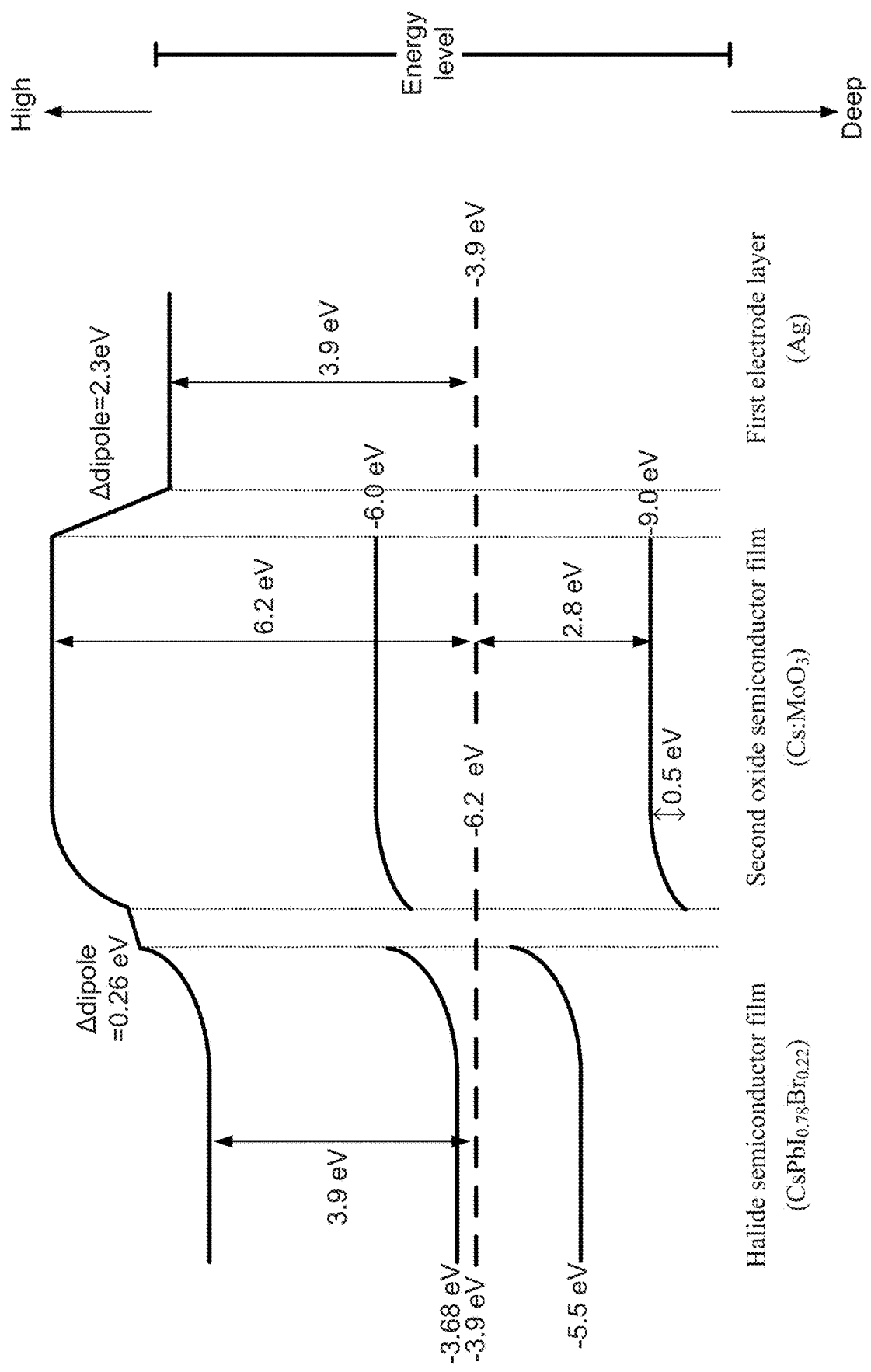
FIG. 5B shows an energy band diagram of the halide semiconductor film, a second oxide semiconductor film and a second electrode layer that are shown in FIG. 4.

Moreover, as FIG. 5B shows, the third CBM level of the second oxide semiconductor film 123 is deeper than the second CBM level of the halide semiconductor film 122, the third fermi level of the second oxide semiconductor film 123 is deeper than the second fermi level of the halide semiconductor film 122, and the third VBM level of the second oxide semiconductor film 123 is deeper than the second VBM level of the halide semiconductor film 122, such that a second carrier energy barrier is formed between the second oxide semiconductor film 123 and the halide semiconductor film 122 in case of a second equivalent energy-level structure being formed between the second oxide semiconductor film 123 and the halide semiconductor film 122.

As described more in detail below, FIG. 5A and FIG. 5B also depict that, a first interfacial dipole is formed between the first oxide semiconductor film 121 and the halide semiconductor film 122, and a second interfacial dipole is formed between the first oxide semiconductor film 121 and the first electrode layer 11. Moreover, a third interfacial dipole is formed between the second oxide semiconductor film 123 and the halide semiconductor film 122, and a fourth interfacial dipole is formed between the second oxide semiconductor film 123 and the second electrode layer 13. It is worth explaining that, an absolute value of the second interfacial dipole (2.0 eV) is greater than that of the first interfacial dipole (0.26 eV), and an absolute value of the fourth interfacial dipole is greater than that of the third interfacial dipole. From FIG. 5A and FIG. 5B, it should be aware that the halide semiconductor film 122 is exemplarily made of an inorganic perovskite of $CsPbI_xBr_y$, wherein x is 0.78 and y is 0.22. On the other hand, both the first oxide semiconductor film 121 and the second oxide semiconductor film 123 are exemplarily made of a transition metal oxide ($MoO_3$) that is doped with alkali metal (Cs). Moreover, the first electrode layer 11 and the second electrode layer 13 are respectively made of indium tin oxide (ITO) and silver (Ag).

Particularly speaking, the principal technology feature of the present invention is not in selection of specific materials for the first electrode layer 11, the active layer 12 and the second electrode layer 13 of the halide semiconductor memristor 13, but is in forming a first carrier energy barrier between the first oxide semiconductor film 121 and the halide semiconductor film 122 as well as building a second carrier energy barrier between the second oxide semiconductor film 123 and the halide semiconductor film 122. Therefore, material engineers certainly know that the halide semiconductor film 122 is not limited to be made of $CsPbI_xBr_y$, but it can be made of a material of inorganic perovskite or a material of hybrid organic-inorganic perovskite. In conclusion, the halide semiconductor film 122 can be made of a material of $ABX1_x$, $ABX1_x X2_y$, $MABX1_x$, $MABX1_x X2_y$, $FABX1_x$, or $FABX1_x X2_y$. In which, A is selected from the group consisting of Li, Na, k, Rb, Cs, and B is selected from the group consisting of Cu, Ni, Co, Fe, Mn, Cr, Pb, Cd, Ge, and Sn. Moreover, MA is $CH_3NH_3$, FA is $NH_2CHNH_2$, and both X1 and X2 are selected from the group consisting of Cl, Br, and I.

Similarly, the first oxide semiconductor film 121 and the second oxide semiconductor film 123 are also not limited to be made of $Cs:MoO_3$, but can both be made of a transition metal oxide that is selected from the group consisting of $NiO_x$, $CuO_x$, $CrO_x$, $MoO_x$ $WO_3$, and $V_2O_5$. Herein, it is worth noting that, the forgoing transition metal oxide can be further doped with an alkali metal that is selected from the group consisting of Li, Na, K, Rb, and Cs. As such, it should be aware that, the first electrode layer 11 is not limited to be made of Ag, and the second electrode layer 13 is not limited to be made of ITO. In one practicable embodiment, both the first electrode layer 11 and the second electrode layer 13 can be made of a material that is selected from the group consisting of silver (Ag), gold (Au), platinum (Pt), indium tin oxide (ITO), fluorine-doped tin oxide (FTO), indium zinc oxide (IZO), gallium doped zinc oxide (GZO), and aluminum-doped zinc oxide (AZO).

Experimental Data

Therefore, above descriptions have introduce the structure of the halide semiconductor memristor 1 of the present invention completely and clearly. In following paragraphs, a variety of experimental data will be provided for showing the fact that this novel halide semiconductor memristor 1 is indeed suitable for being as an artificial synapse. To complete a verification experiment, a sample of the halide semiconductor memristor 1 is made. Following Table (1) lists manufacturing materials for the fabrication of the sample.

TABLE (1)

| First electrode layer 11 | First oxide semiconductor film 121 | Halide semiconductor film 122 | Second oxide semiconductor film 123 | Second electrode layer 13 |
|---|---|---|---|---|
| ITO | $Cs:MoO_3$ | $CsPbI_{0.78}Br_{0.22}$ | $Cs:MoO_3$ | Ag |

Figure 6:
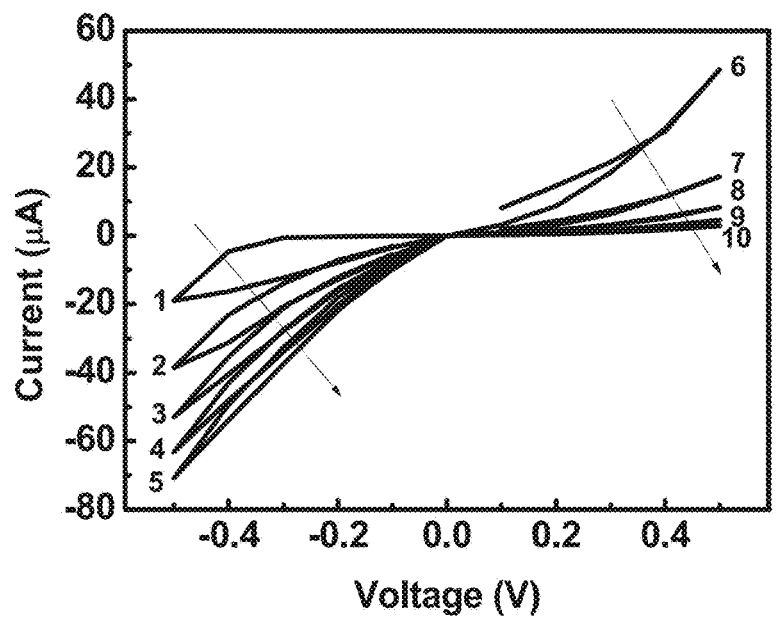
FIG. 6 shows a curve graph of voltage versus current.

It is known that, a synapse is a structure that permits a neuron (or nerve cell) to pass an electrical or chemical signal to another neuron in the nervous system. Moreover, synaptic plasticity is found to be the fundamental mechanism of learning and memory. Accordingly, synaptic plasticity is regarded as one of import reference indexes that is adopted for determining wherein the halide semiconductor memristor 1 of the present invention is suitable for being as an artificial synapse or not. FIG. 6 shows a curve graph of voltage versus current. After completing 5 times (1→5) of DC voltage sweeping of the halide semiconductor memristor 1 (as shown in FIG. 4) with operating voltage ranged from 0V to −0.5V, it can observe that, an output current of the halide semiconductor memristor 1 measured in the current time of DC voltage sweeping is greater than the output current of halide semiconductor memristor 1 that is measured in previous time of the DC voltage sweeping. On the other hand, After finishing another 5 times (6→10) of DC voltage sweeping of the halide semiconductor memristor 1 with operating voltage ranged from 0V to 0.5V, it is able to find that, an output current of the halide semiconductor memristor 1 measured in the current time of DC voltage sweeping is smaller than the output current of halide semiconductor memristor 1 that is measured in previous time of the DC voltage sweeping. As a result, experimental data of FIG. 6 have proved that, the resistance of the halide semiconductor memristor 1 of the present invention is getting higher according to the history of the current flowing through the halide semiconductor memristor 1.

Figure 7:
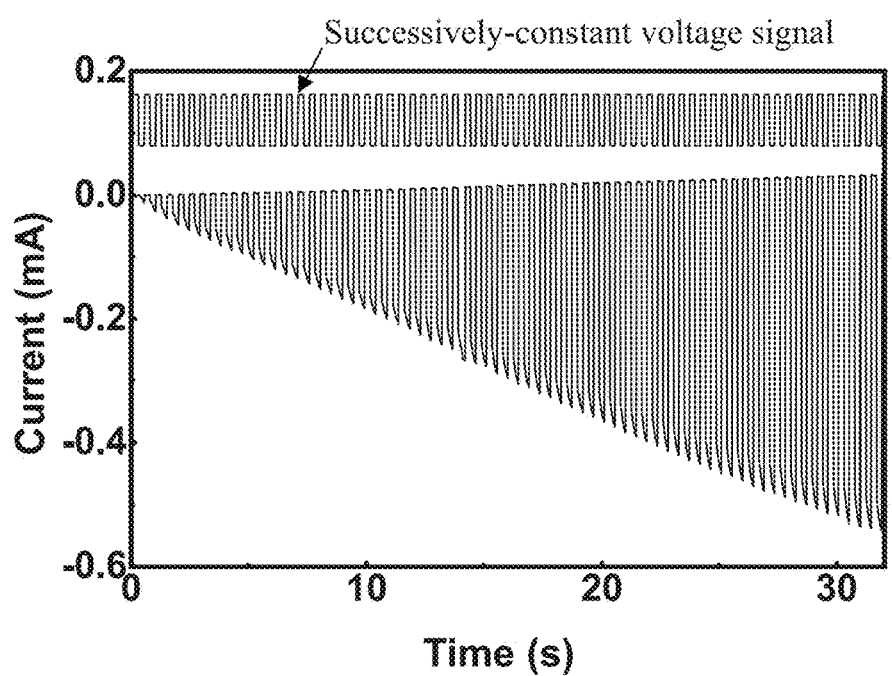
FIG. 7 shows a curve graph of time versus current.
Figure 8:
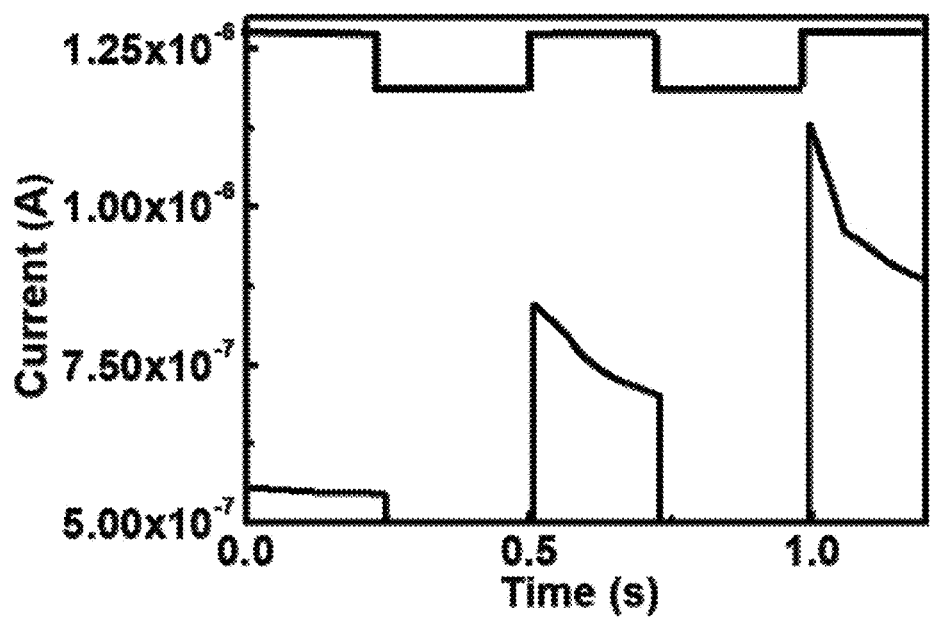
FIG. 8 shows a curve graph of time versus current.

FIG. 7 illustrates a curve graph of time versus current. From FIG. 7, it is observed that, the current measured from the halide semiconductor memristor 1 is getting higher in the case of a successively-constant voltage signal being applied to the halide semiconductor memristor 1. Consequently, experimental data of FIG. 7 have proved that, the resistance of the halide semiconductor memristor 1 of the present invention is getting samller according to the history of the current flowing through the halide semiconductor memristor 1. On the other hand, there are many research reports have indicated that, when a pre-synaptic neuron receives two stimuli in rapid succession, the post-synaptic response would commonly be larger for the second than for the first pulse. Such phenomenon is known as paired-pulse facilitation (PPF), and is also regarded as another one of import reference indexes. Please refer to FIG. 8, which illustrates experimental data of a curve graph that is plotted by letting time as abscissa and current as ordinate. Experimental data of FIG. 8 reveal that, as long as a time interval (time spacing) between a first-time stimulating signal (voltage) and a second-time stimulating signal (voltage) that are received by the halide semiconductor memristor 1 is adequately short, a second-time output current of the halide semiconductor memristor 1 will be greater than a first-time output current. Herein, the term "adequately-short time interval" means that the halide semiconductor memristor 1 continuously receives the second-time stimulating signal (voltage) before a stimulation effect induced by the first-time stimulating signal (voltage) does not fully subside.

Figure 9:
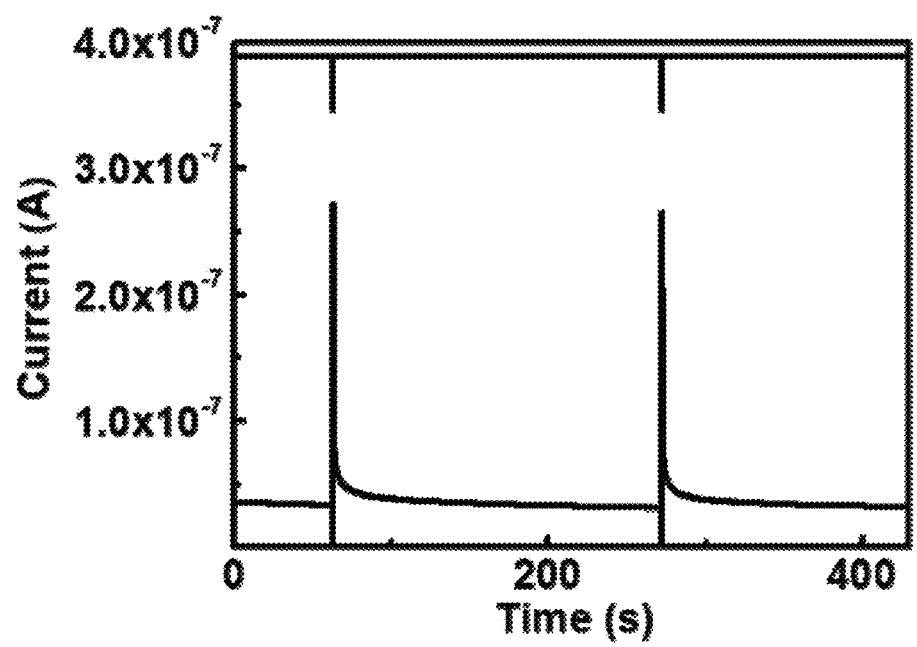
FIG. 9 shows a curve graph of time versus current.
Figure 10:
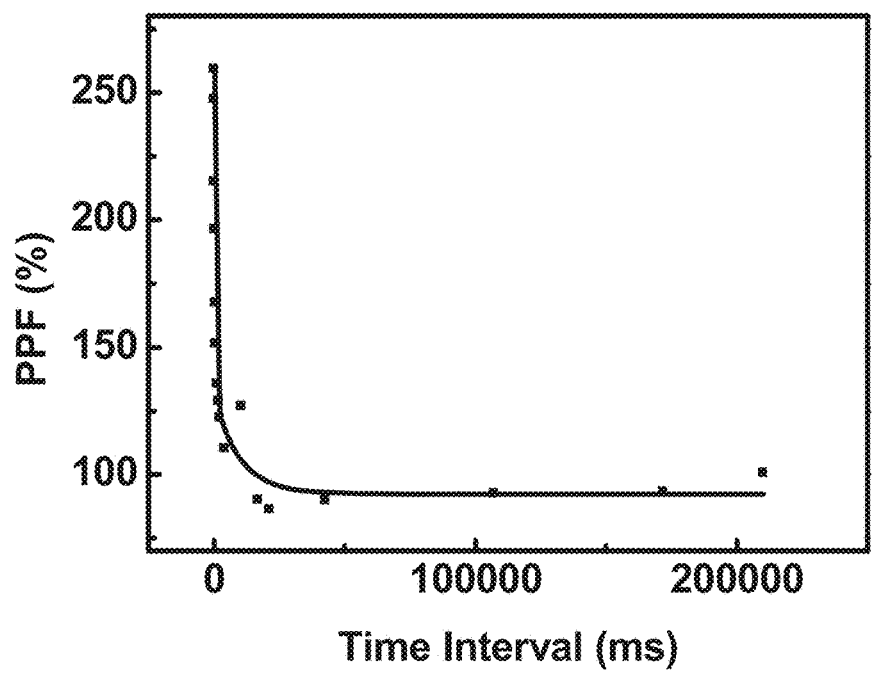
FIG. 10 shows a data curve graph of time interval versus paired pulse facilitation (PPF)

Please refer to FIG. 9, there is provided a curve graph of time versus current. As FIG. 9 shows, in case of the time interval between any two times of stimulating signals being too long, a currently-measured output current of the halide semiconductor memristor 1 is almost equal to a previously-measured output current. On the other hand, FIG. 10 shows a data curve graph of time interval versus paired pulse facilitation (PPF). It is worth noting that, experimental data of FIG. 10 exhibit that the PPF is getting higher with the dropping down of the time interval (time spacing).

Figure 11:
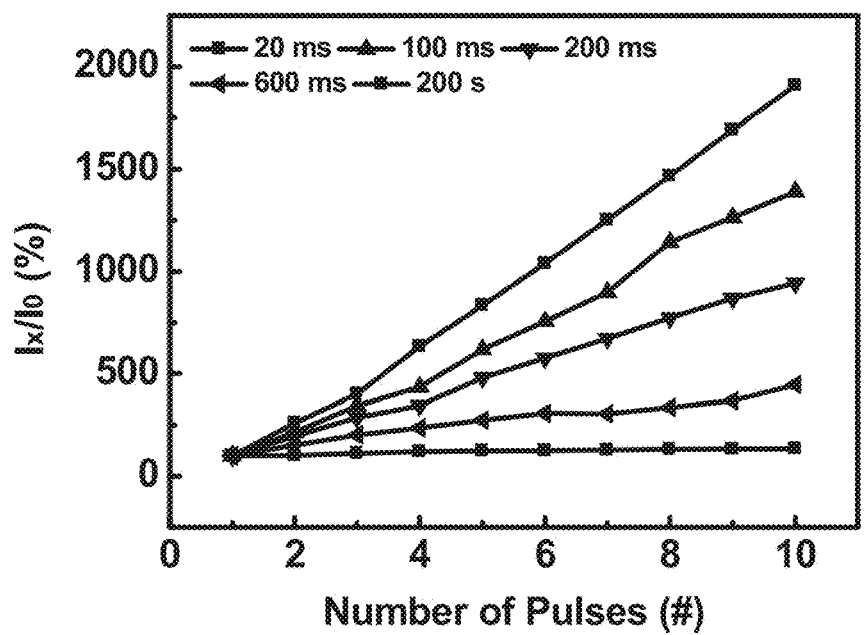
FIG. 11 shows a data curve graph of number of pulses versus current ratio.
Figure 12:
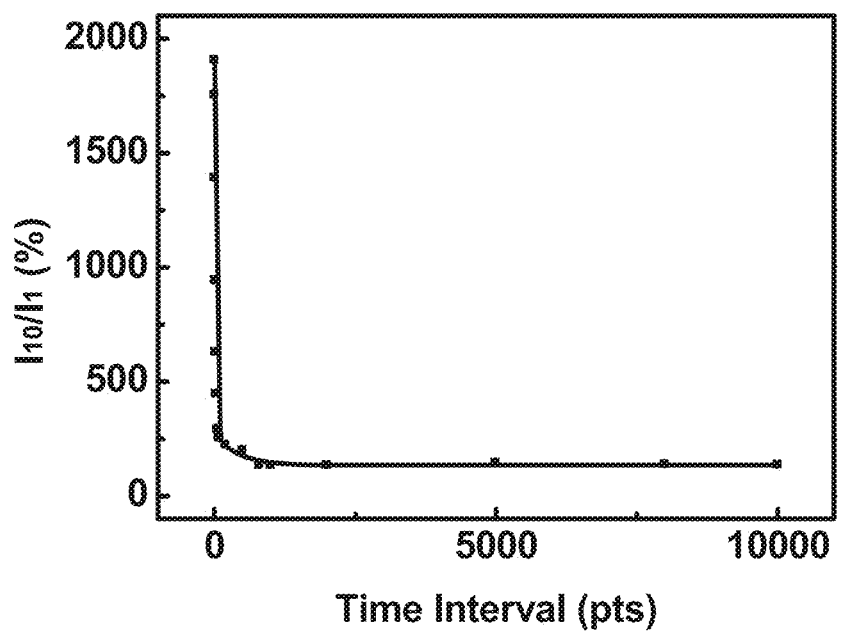
FIG. 12 shows a data curve graph of time interval versus current ratio.

In addition, related research reports have indicated that, Spiking-rate-dependent plasticity (SRDP) is one of the basic learning rules of long-term plasticity in the neural network where the synaptic weight changes according to the rate of presynaptic spikes. Please refer to FIG. 11, there is shown a data curve graph of number of pulses versus current ratio. The provided data curves reveal that, in case of letting the halide semiconductor memristor 1 of the present invention receive an identical stimulating voltage repeatedly and successively, each current ratio of $I_x/I_0$ would increase with the shortening of the time interval of each time stimulating voltage. In which, $I_0$ is the output current measured during the halide semiconductor memristor 1 receiving first-time stimulating voltage, and $I_x$ means the output current measured in case of a N-th time of stimulating voltage being applied to the halide semiconductor memristor 1. On the other hand, FIG. 12 shows a data curve graph of time interval versus current ratio. It is clear that, experimental data of FIG. 11 and FIG. 12 have proved that, the halide semiconductor memristor 1 of the present invention can indeed be used as an artificial synapse because of having the property of SRDP.

On the other hand, related research reports have also indicated that, spike-timing-dependent plasticity (STDP) is a biological process that adjusts the strength of connections between a pre-neuron and a post-neuron in nervous system. The STDP process adjusts the connection strengths based on the relative timing of a particular neuron's output and input action potentials (or spikes). In general, short intervals produce maximal plasticity, while longer intervals produce little or no change in synaptic strength. STDP refers to a form of associative synaptic plasticity in which the temporal order of the pre-synaptic and post-synaptic action potentials determines the direction of plasticity, that is, whether synaptic depression or potentiation is induced. In the most common form of STDP, long-term potentiation is induced if the presynaptic spike precedes the postsynaptic spike (pre-→post), whereas long-term depression is induced if the postsynaptic spike precedes the presynaptic spike (post-→pre). Therefore, STDP is often interpreted as the comprehensive learning rule for a synapse.

Figure 13:
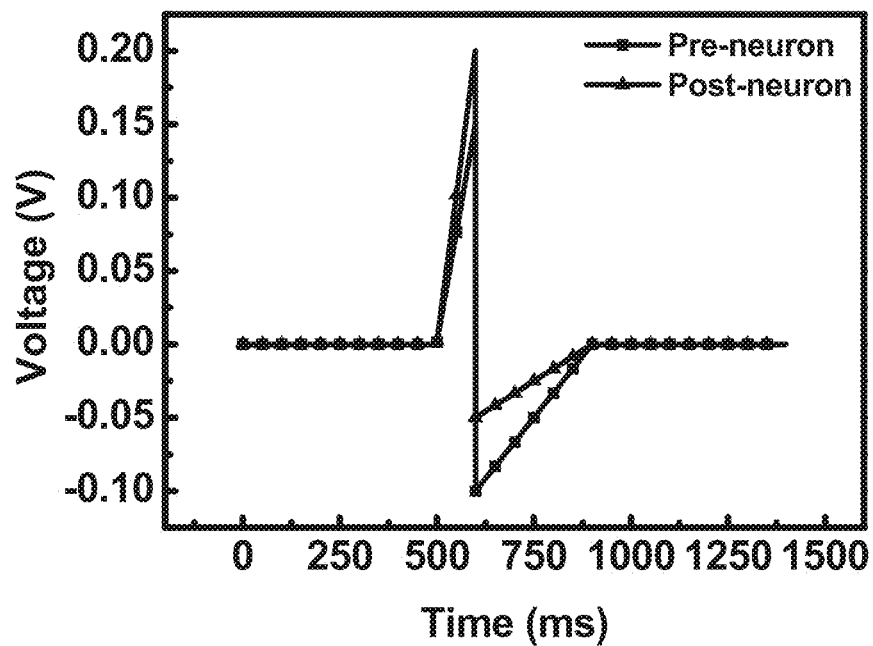
FIG. 13 shows a curve graph for describing a waveform signal comprising a received signal of a pre-neuron and a transmitted signal of a post-neuron.
Figure 14:
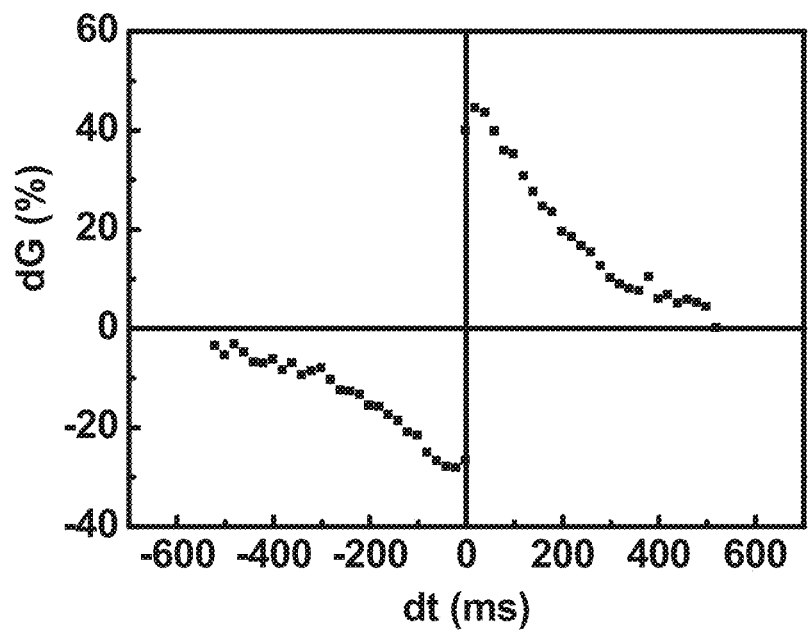
FIG. 14 shows a graph of a measured STDP learning curve.

When executing related experiment for verifying the STDP property of the halide semiconductor memristor 1, a spike signal with a special waveform is provided so as to be inputted to a pre-neuron. Subsequently, a time difference between a first signal transmitting time and a second signal transmitting time is modulated for enhancing the STDP property of the halide semiconductor memristor 1. Herein, it needs to further explain that, the halide semiconductor memristor 1 of the present invention is connected between the pre-neuron and a post-neuron. Moreover, the first signal transmitting time means the time of the pre-neuron receiving a stimulating signal (i.e., the spike signal), and the second signal transmitting time is the time of the post-neuron outputting the spike signal. As described more in detail below, the spike signal is sent to the second electrode layer 13 (as shown in FIG. 4), such that it is able to measure the spike signal from the first electrode layer 11. Please refer to FIG. 13, which provides a curve graph for describing a waveform signal comprising a received signal (i.e., the spike signal) of the pre-neuron and a transmitted signal (i.e., the spike signal) of the post-neuron. In addition, FIG. 14 shows a graph of a measured STDP learning curve, which is plotted by letting the time difference as abscissa and Gain of conductance (dG) of the halide semiconductor memristor 1 as ordinate. From experimental data of FIG. 14, it is observed that, dG value is getting higher with the fact that the time difference is shortened from 500 ms to 0 ms, meaning that the connection strength of synapse is enhanced. Similar, in case of the time difference being shortened from −600 ms to 0 ms, dG value is more and more high. As such, related experimental data have proved that the halide semiconductor memristor 1 has an outstanding STDP property.

Figure 15:
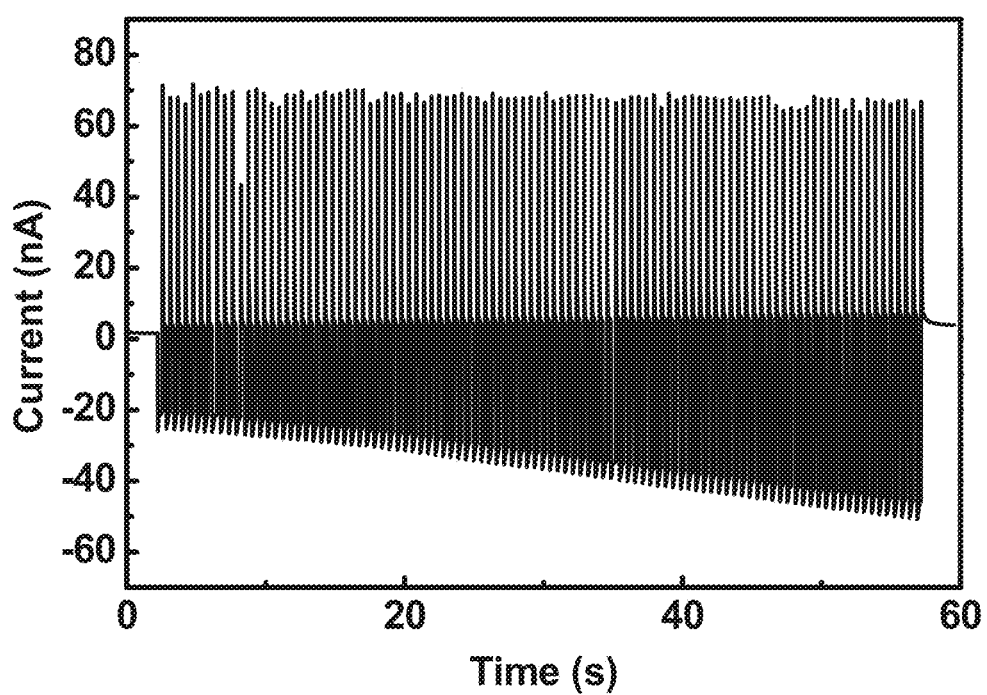
FIG. 15 shows a curve graph of time versus current.

From above descriptions, it is understood that the halide semiconductor memristor 1 of the present invention indeed has the properties of synaptic plasticity and STDP learning, such that this halide semiconductor memristor 1 is suitable for being used as an artificial synapse. Subsequently, following paragraphs will continuously introduce other outstanding properties of the halide semiconductor memristor 1 through assistance of various experimental data. FIG. 15 shows a curve graph of time versus current, and the curve graph is measured by respectively applying a small constant voltage (Vbias=0.05V) and a pulse voltage signal of −0.1V to the first electrode layer 11 and the second electrode layer 13 as shown in FIG. 4. As described more in detail below, the pulse voltage signal has a pulse width of 200 ms and a duty cycle of 50%. From experimental data of FIG. 15, it is observed that, the resistance of the halide semiconductor memristor 1 of the present invention is getting higher according to the history of the current flowing through the halide semiconductor memristor 1. Briefly speaking, it is able to activate the synaptic plasticity of the halide semiconductor memristor 1 by using a small stimulating voltage.

Figure 16:
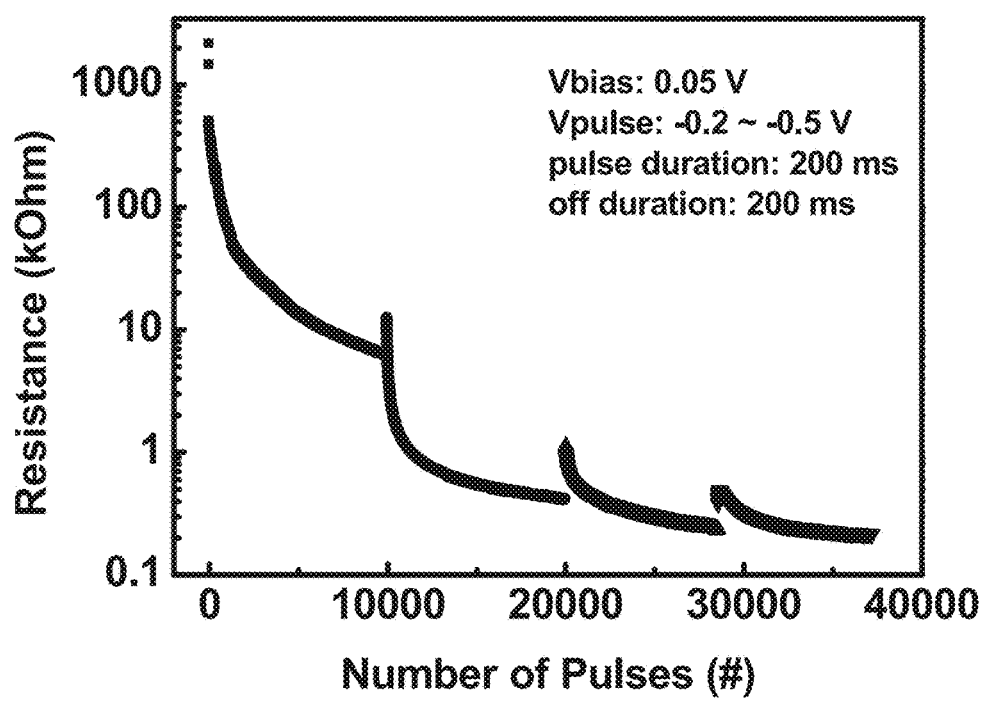
FIG. 16 shows a curve graph of number of pulses versus resistance.
Figure 17:
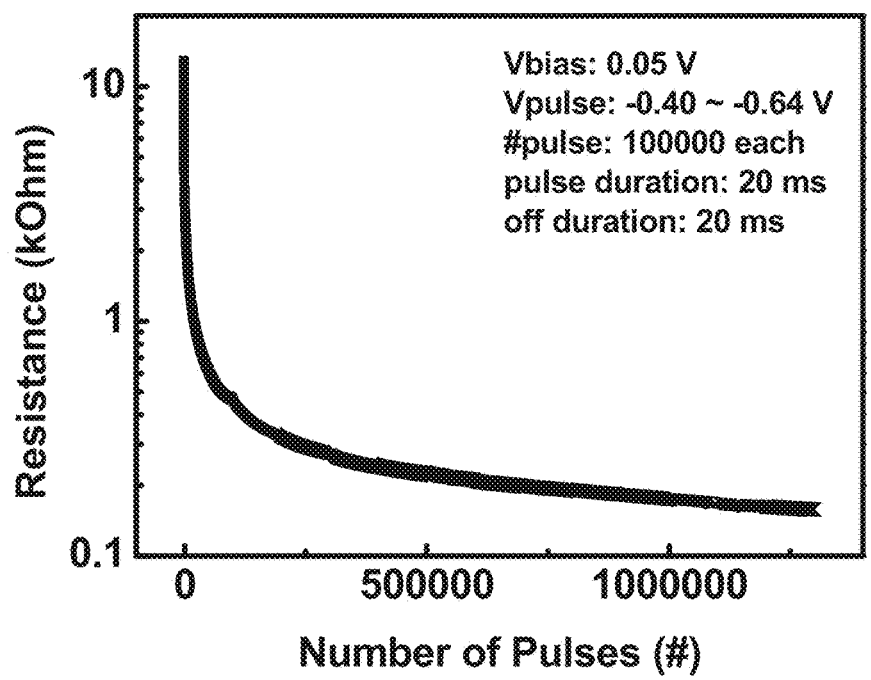
FIG. 17 shows a curve graph of number of pulses versus resistance.
Figure 18:
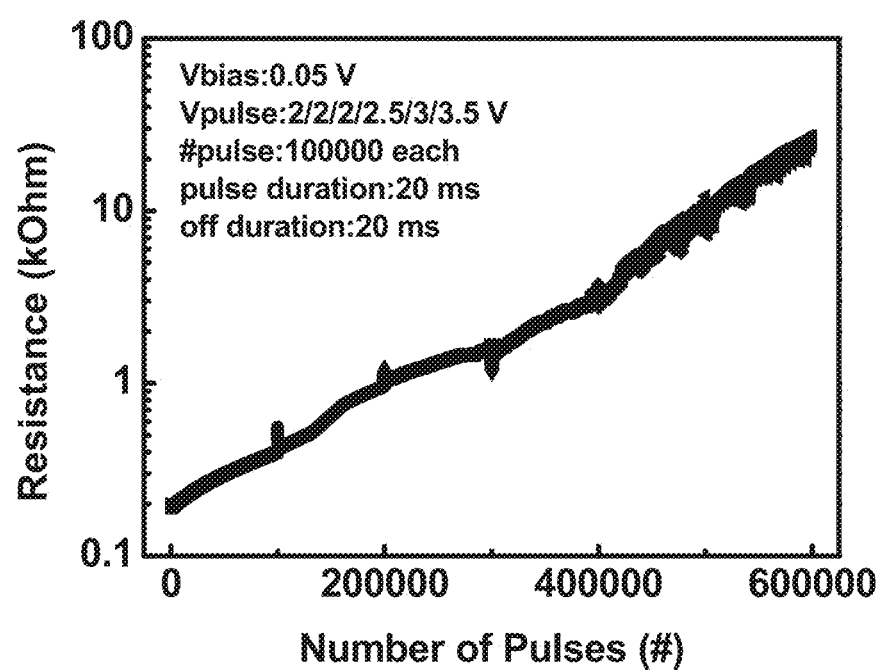
FIG. 18 shows a curve graph of number of pulses versus resistance.

Please continuously refer to FIG. 16, there is shown a curve graph of number of pulses versus resistance. Experimental data of FIG. 16 is collected by applying a small constant voltage (Vbias=0.05V) to the first electrode layer 11 as well as letting a plurality of stimulating signals that have different pulse voltages in range between −0.2V and −0.5V be transmitted to the second electrode layer 13. It is worth noting that, the experimental data of FIG. 16 have indicated that, there are 3 orders of dynamic range of analog switching in this halide semiconductor memristor 1 in the case of the halide semiconductor memristor 1 being biased by the small constant voltage and receiving the various stimulating pulse voltages. Furthermore, FIG. 17 and FIG. 18 show two curve graphs of number of pulses versus resistance. It is clear that, experimental data of FIG. 17 and FIG. 18 reveal that the halide semiconductor memristor 1 has a considerable number of adjustable resistance states that are greater than 1 million.

Embodiment of Neuromorphic Device

Figure 19:
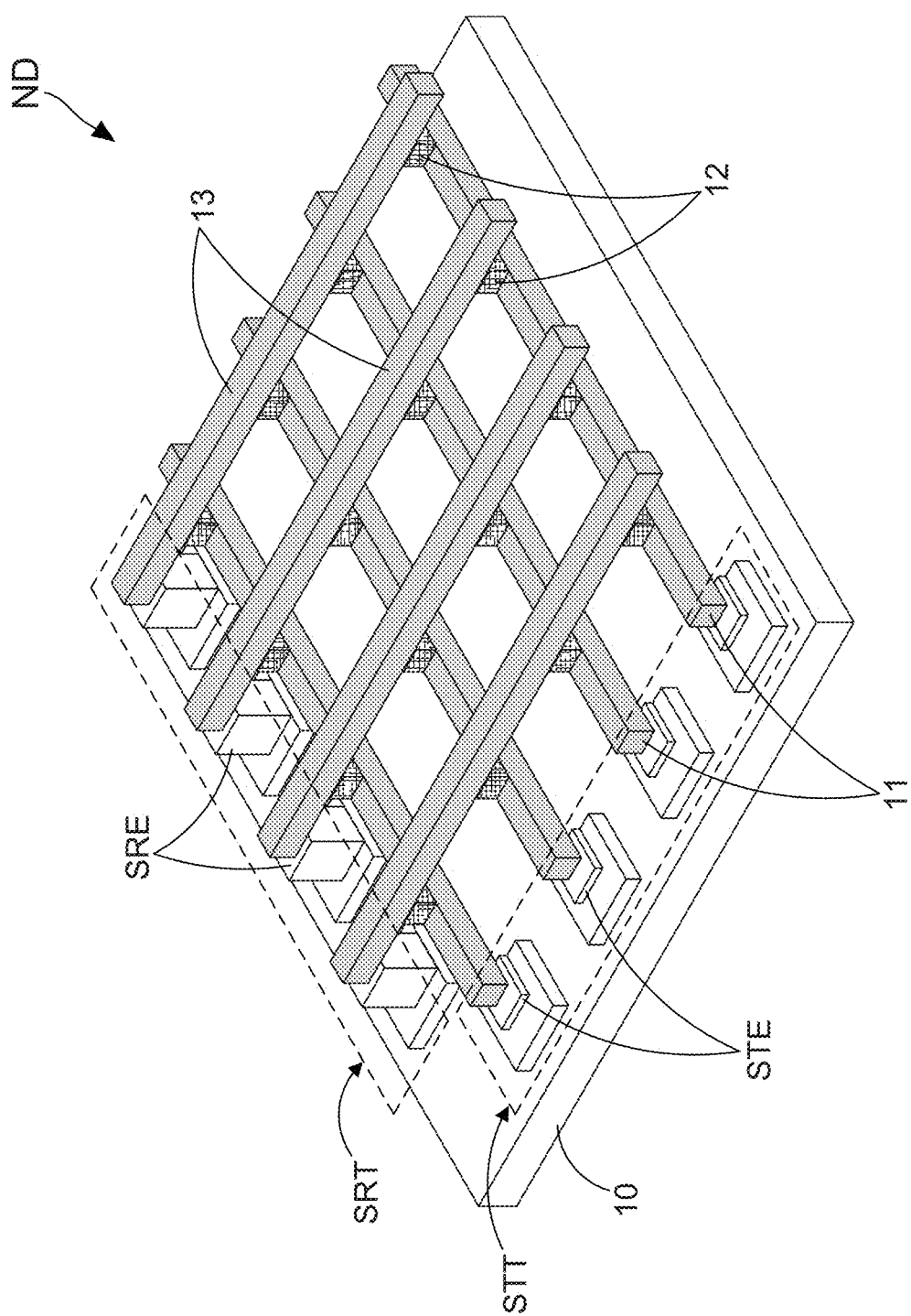
FIG. 19 shows a schematic stereo diagram of a neuromorphic device using a number of the halide semiconductor memristors as a plurality of artificial synapses thereof.
Figure 20:
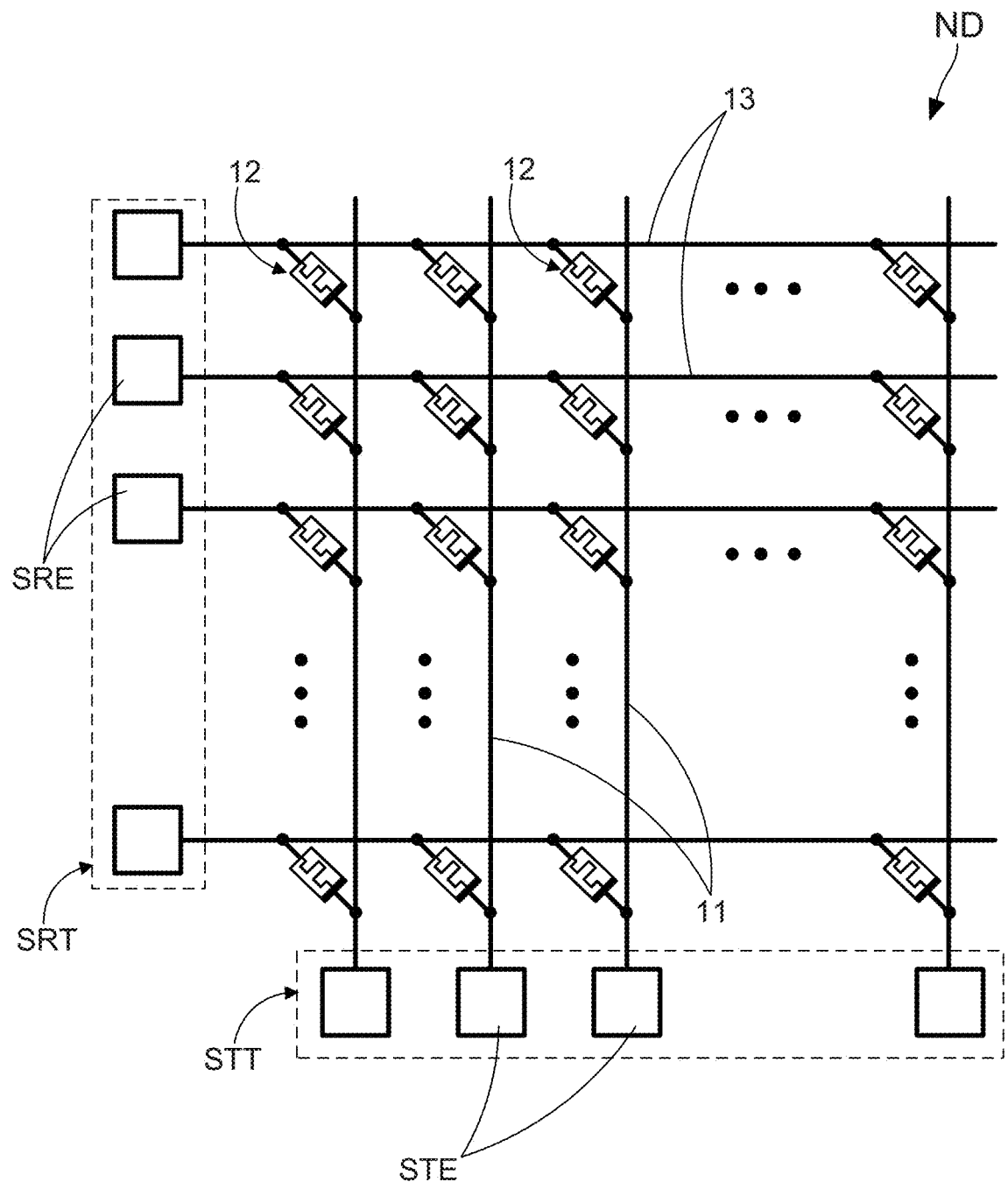
FIG. 20 shows a framework diagram of the neuromorphic device.

Accordingly, above descriptions have reported that the halide semiconductor memristor 1 of the present invention has outstanding properties of capable of being driven by a low operating voltage, having a multi-stage (multi-level) adjustable resistance state, and a wide dynamic range of the switching resistance states, thereby being the most suitable to be an artificial synapse. Next, following paragraphs will subsequently introduce an embodiment for a neuromorphic device that adopting a plurality of the above-described halide semiconductor memristors 1 as M×N numbers of artificial synapses. FIG. 19 shows a schematic stereo diagram of the neuromorphic device using a number of the halide semiconductor memristors as a plurality of artificial synapses thereof Moreover, FIG. 20 shows a framework diagram of the neuromorphic device. As FIG. 19 and FIG. 20 show, the neuromorphic device ND comprises: a substrate 10, a signal receiving unit SRT, M×N numbers of the halide semiconductor memristors 1 of the present invention, and a signal transmitting unit STT. In which, the a signal receiving unit SRT is disposed on the substrate 10, and comprises a plurality of signal receiving electrodes SRE. On the other hand, the signal transmitting unit STT is disposed on the substrate 10, and comprises a plurality of signal transmitting electrode STE. Particularly explaining, the respective signal receiving electrodes SRE are used as respective pre-neurons, and each of the plurality of signal transmitting electrode STE is adopted as one post-neuron. Of course, since the active layer 12 of the halide semiconductor memristor 1 has a sandwich symmetric structure, it is able to respectively take the signal transmitting electrode STE and the signal receiving electrode SRE as the pre-neuron and the post-neuron in a practical use of the neuromorphic device ND.

Figure 21:
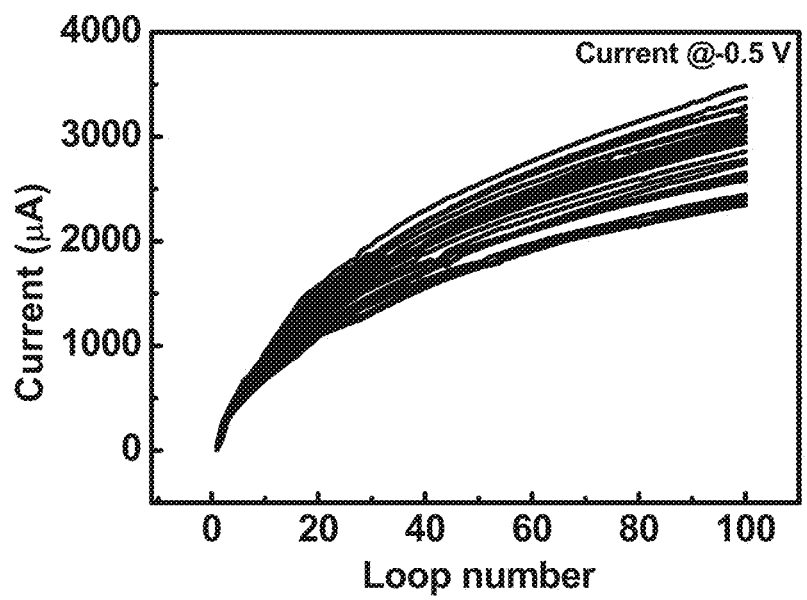
FIG. 21 shows a curve graph of loop number versus current.

As described more in detail below, M×N numbers of the halide semiconductor memristors 1 are disposed on the substrate 10. FIG. 4 has depicted that each the halide semiconductor memristor 1 comprises a first electrode layer 11, an active layer 12 formed on the first electrode layer 11, and a second electrode layer 12 formed on the active layer 13. It is noting that, the respective signal receiving electrodes SRE are connected to the respective second electrode layers 13, and the respective signal transmitting electrodes STE are connected to the respective first electrode layers 11. FIG. 21 shows a curve graph of loop number versus current. To obtain the experimental data of FIG. 21, it needs to firstly apply a sweep voltage to the respective second electrode layers 13 through the respective signal receiving electrodes SRE, and then measuring each output current of the respective halide semiconductor memristors 1 by way of applying a small reading voltage (Vbias=0.05V) to the respective first electrode layers 12 through the respective signal transmitting electrodes STE. Herein, it is worth further explaining that, the sweep voltage is firstly modulated in a range between 0V and −0.5V, and is subsequently adjusted from −0.5V to 0V, so as to complete a loop of a voltage sweeping operation. After obtaining the experimental data of FIG. 21, inventors of the present invention further finish a variety of statistical analyses of the respective output currents that are collected from the M×N numbers of the halide semiconductor memristors 1 disposed on the substrate 10, including: arithmetic mean, standard deviation and coefficient of variation, such that device variations between the M×N numbers of the halide semiconductor memristors 1 are able to be analyzed.

Figure 22:
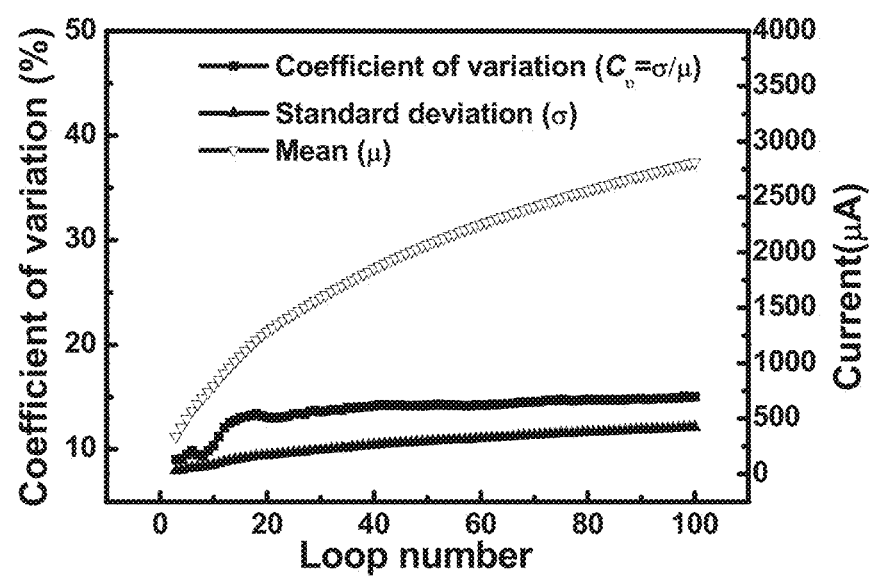
FIG. 22 shows a curve graph of loop number versus coefficient of variation.
Figure 23:
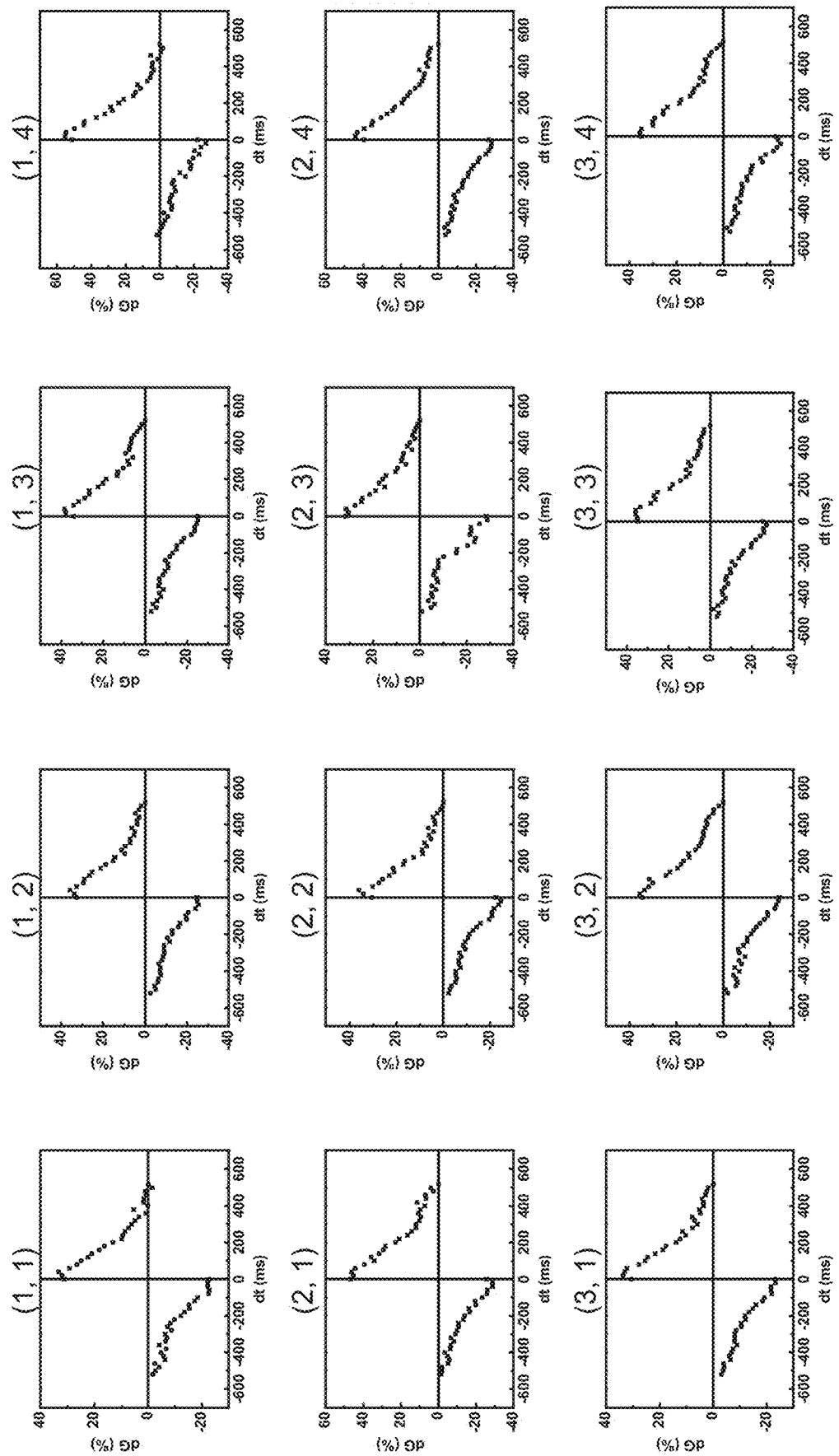
FIG. 23 shows a plurality of graphs for correspondingly showing a plurality of measured STDP learning curves.

FIG. 22 shows a curve graph of loop number versus coefficient of variation. Clearly, statistical data of coefficient of variation have proved that all of the halide semiconductor memristors 1 of the neuromorphic devices ND have a device variation smaller than 15%. Furthermore, FIG. 23 provides a plurality of graphs for correspondingly showing a plurality of measured STDP learning curves. It should be aware that, there are 23 measured STDP learning curves shown in FIG. 23. Moreover, the most important thing is that, the 3×4 numbers of the halide semiconductor memristors 1 of the neuromorphic devices ND all exhibit outstanding property of STDP learning. Moreover, the 3×4 numbers of the halide semiconductor memristors 1 of the neuromorphic devices ND success to have a uniform device performance with consistence and repeatability.

Second Embodiment of Halide Semiconductor Memristor 1

Figure 24:
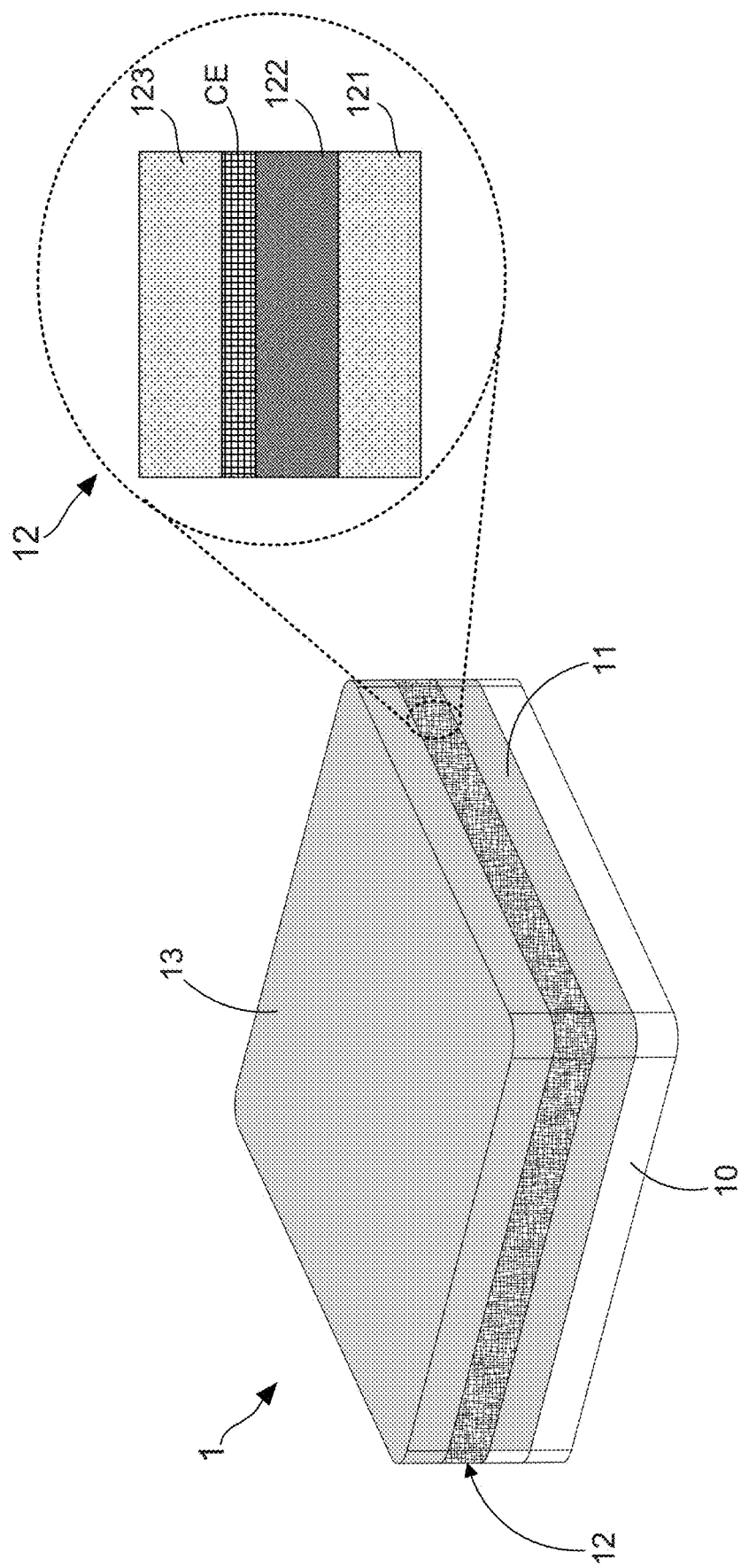
FIG. 24 shows a schematic stereo diagram of a second embodiment of the halide semiconductor memristor according to the present invention.

With reference to FIG. 24, there is shown a schematic stereo diagram of a second embodiment of the halide semiconductor memristor according to the present invention. After comparing FIG. 4 with FIG. 24, it is able to find that the second embodiment of the halide semiconductor memristor 1 further comprises a current enhancing film CE, which is formed between the second oxide semiconductor film 123 and the halide semiconductor film 122. In second embodiment, the current enhancing film CE is made of a metal halide that is selected from the group consisting of CuI, CuBr, AgI, AgBr, AuI, AuBr, PtI, and PtBr.

Figure 25:
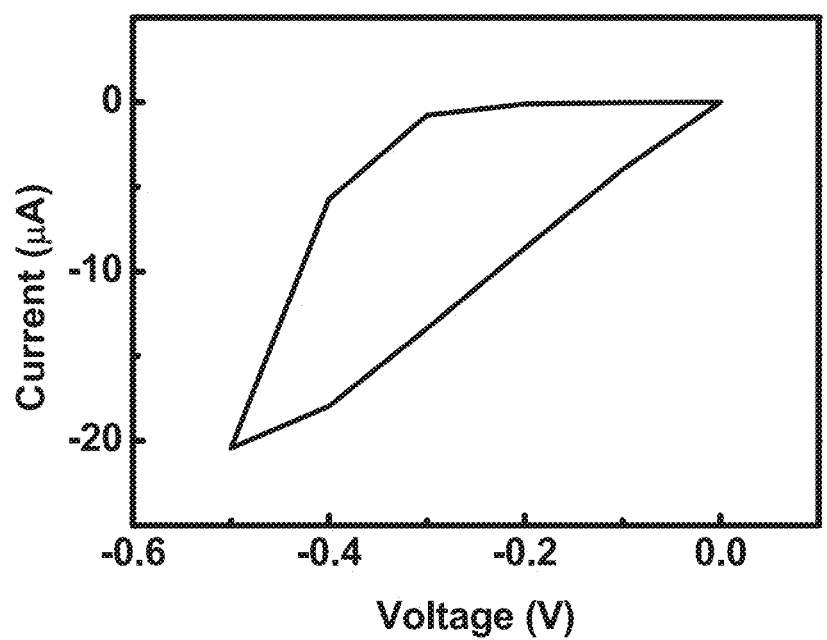
FIG. 25 shows a curve graph of voltage versus current measured from the first embodiment of the halide semiconductor memristor.
Figure 26:
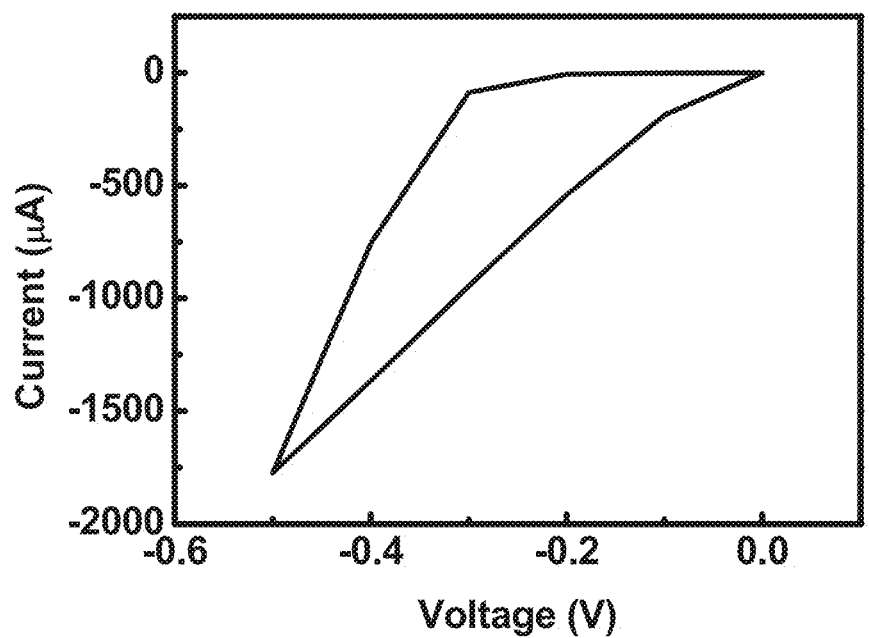
FIG. 26 shows a curve graph of voltage versus current measured from the second embodiment of the halide semiconductor memristor.

Please subsequently refer to FIG. 25 and FIG. 26, wherein FIG. 25 shows a curve graph of voltage versus current measured from the first embodiment of the halide semiconductor memristor, and FIG. 26 illustrates a curve graph of voltage versus current measured from the second embodiment of the halide semiconductor memristor. By comparing FIG. 25 and FIG. 26, it is understood that the current enhancing film CE is largely helpful in the enhancement of the output current of the halide semiconductor memristor 1. Particularly, data of FIG. 26 have reported that there are 2 orders of the enhancement of the output current after the current enhancing film CE is added between the second oxide semiconductor film 123 and the halide semiconductor film 122.

Therefore, through above descriptions, the halide semiconductor memristor and the neuromorphic device using a number of the halide semiconductor memristors as a plurality of artificial synapses that are proposed by the present invention have been introduced completely and clearly; in summary, the present invention includes the advantages of:

The present invention discloses a halide semiconductor memristor 1 that is suitable for being as an artificial synapse. The halide semiconductor memristor 1 comprises a first electrode layer 11, an active layer 12 and a second electrode layer 13, wherein the active layer 12 comprises a first oxide semiconductor film 121 formed on the first electrode layer 11, a halide semiconductor film 122 formed on the first oxide semiconductor film 121, and a second oxide semiconductor film 123 formed on the halide semiconductor film 122. By such arrangement, there is a first carrier energy barrier formed between the first oxide semiconductor film 121 and the halide semiconductor film 122 as well as a second carrier energy barrier formed between the second oxide semiconductor film 123 and the halide semiconductor film 122. Moreover, a variety of experimental data have proved that, this halide semiconductor memristor 1 is indeed suitable for being adopted as M×N numbers of artificial synapses that are used in manufacture of a neuromorphic device ND. It is worth explaining that, each of the M×N numbers of the halide semiconductor memristors 1 exhibits many advantages, including: capable of being driven by a low operation voltage, having a multi-stage adjustable resistance state, and a wide dynamic range of the switching resistance states.

Moreover, statistical data of coefficient of variation have clearly proved that all of the halide semiconductor memristors 1 of the neuromorphic devices ND have a device variation smaller than 15%, meaning that the M×N numbers of the halide semiconductor memristors 1 of the neuromorphic devices ND success to have a uniform device performance with consistence and repeatability.

The above description is made on embodiments of the halide semiconductor memristor and the neuromorphic device according to the present invention. However, the embodiments are not intended to limit scope of the present invention, and all equivalent implementations or alterations within the spirit of the present invention still fall within the scope of the present invention.

What is claimed is:

1. A halide semiconductor memristor comprising:
   a first electrode layer;
   an active layer, comprising:
   a first oxide semiconductor film formed on the first electrode layer, having a first conduction band minimum (CBM) level, a first fermi level and a first valence band maximum (VBM) level;
   a halide semiconductor film formed on the first oxide semiconductor film, having a second CBM level, a second fermi level and a second VBM level; and
   a second oxide semiconductor film formed on the halide semiconductor film, having a third CBM level, a third fermi level and a third VBM level; and
   a second electrode layer formed on the second oxide semiconductor film;
   wherein the halide semiconductor film is made of $CsPbI_xBr_y$, or a hybrid organic-inorganic perovskite material, and x=0.78 and y=0.22;
   wherein both the first oxide semiconductor film and the second oxide semiconductor film are made of a transition metal oxide that is selected from a group consisting of nickel oxide, copper oxide, chromium oxide, molybdenum oxide, tungsten oxide, and vanadium oxide;
   wherein an absolute value of the first CBM level of the first oxide semiconductor film is greater than the second CBM level of the halide semiconductor film, an absolute value of the first fermi level of the first oxide semiconductor film being greater than the second fermi level of the halide semiconductor film, and an absolute value of the first VBM level of the first oxide semiconductor film being greater than the second VBM level of the halide semiconductor film, such that a first carrier energy barrier is formed between the first oxide semiconductor film and the halide semiconductor film;
   wherein an absolute value of the third CBM level of the second oxide semiconductor film is greater than the second CBM level of the halide semiconductor film, an absolute value of the third fermi level of the second oxide semiconductor film being greater than the second fermi level of the halide semiconductor film, and an absolute value of the third VBM level of the second oxide semiconductor film being greater than the second VBM level of the halide semiconductor film, such that a second carrier energy barrier is formed between the second oxide semiconductor film and the halide semiconductor film.

2. The halide semiconductor memristor of claim 1, further comprising a substrate for supporting the first electrode layer, the active layer and the second electrode layer.

3. The halide semiconductor memristor of claim 1, further comprising:
   a current enhancing film, being formed between the second oxide semiconductor film and the halide semiconductor film, and being made of a metal halide.

4. The halide semiconductor memristor of claim 1, wherein both the first electrode layer and the second electrode layer are made of a material that is selected from a group consisting of silver (Ag), gold (Au), platinum (Pt), indium tin oxide (ITO), fluorine-doped tin oxide (FTO), indium zinc oxide (IZO), gallium doped zinc oxide (GZO), and aluminum-doped zinc oxide (AZO).

5. The halide semiconductor memristor of claim 1, wherein the transition metal oxide is further doped with an alkali metal that is selected from a group consisting of Li, Na, K, Rb, and Cs.

6. A neuromorphic device, comprises:
   a substrate;
   a signal receiving unit, being disposed on the substrate, and comprising a plurality of signal receiving electrodes;
   a plurality of halide semiconductor memristors, being disposed on the substrate, and being respectively used as a plurality of artificial synapses; wherein each of the plurality of halide semiconductor memristors comprise a first electrode layer, an active layer formed on the first electrode layer, and a second electrode layer formed on the active layer, and the active layer comprises:
   a first oxide semiconductor film formed on the first electrode layer, having a first conduction band minimum (CBM) level, a first fermi level and a first valence band maximum (VBM) level;
   a halide semiconductor film formed on the first oxide semiconductor film, having a second CBM level, a second fermi level and a second VBM level; and
   a second oxide semiconductor film formed on the halide semiconductor film, having a third CBM level, a third fermi level and a third VBM level; and
   a signal transmitting unit, being disposed on the substrate, and comprising a plurality of signal transmitting electrodes;
   wherein the respective signal receiving electrodes are connected to the respective second electrode layers, and the respective signal transmitting electrodes are connected to the respective first electrode layers;
   wherein the halide semiconductor film is made of $CsPbI_xBr_y$, or a hybrid organic-inorganic perovskite material, and x=0.78 and y=0.22;
   wherein both the first oxide semiconductor film and the second oxide semiconductor film are made of a transition metal oxide that is selected from a group consisting of nickel oxide, copper oxide, chromium oxide, molybdenum oxide, tungsten oxide, and vanadium oxide;
   wherein an absolute value of the first CBM level of the first oxide semiconductor film is greater than the second CBM level of the halide semiconductor film, an absolute value of the first fermi level of the first oxide semiconductor film being greater than the second fermi level of the halide semiconductor film, and an absolute value of the first VBM level of the first oxide semiconductor film being greater than the second VBM level of the halide semiconductor film, such that a first carrier energy barrier is formed between the first oxide semiconductor film and the halide semiconductor film;
   wherein an absolute value of the third CBM level of the second oxide semiconductor film is greater than the second CBM level of the halide semiconductor film, an absolute value of the third fermi level of the second oxide semiconductor film being greater than the second fermi level of the halide semiconductor film, and an absolute value of the third VBM level of the second oxide semiconductor film being greater than the second VBM level of the halide semiconductor film, such that a second carrier energy barrier is formed between the second oxide semiconductor film and the halide semiconductor film.

7. The neuromorphic device of claim 6, wherein both the first electrode layer and the second electrode layer are made of a material that is selected from a group consisting of silver (Ag), gold (Au), platinum (Pt), indium tin oxide (ITO), fluorine-doped tin oxide (FTO), indium zinc oxide (IZO), gallium doped zinc oxide (GZO), and aluminum-doped zinc oxide (AZO).

8. The neuromorphic device of claim 6, further comprising:
 a current enhancing film, being formed between the second oxide semiconductor film and the halide semiconductor film, and being made of a metal halide.

9. The neuromorphic device of claim 6, wherein the transition metal oxide is further doped with an alkali metal that is selected from a group consisting of Li, Na, K, Rb, and Cs.

* * * * *